(12) United States Patent
Yamauchi et al.

(10) Patent No.: US 7,601,603 B2
(45) Date of Patent: Oct. 13, 2009

(54) METHOD FOR MANUFACTURING SEMICONDUCTOR DEVICE

(75) Inventors: Shoichi Yamauchi, Nagoya (JP);
Hitoshi Yamaguchi, Nisshin (JP);
Tomoatsu Makino, Okazaki (JP);
Syouji Nogami, Tokyo (JP); Tomonori Yamaoka, Tokyo (JP)

(73) Assignees: DENSO CORPORATION, Kariya (JP);
Sumitomo Mitsubishi Silicon Corporation, Tokyo (JP)

( * ) Notice: Subject to any disclaimer, the term of this patent is extended or adjusted under 35 U.S.C. 154(b) by 300 days.

(21) Appl. No.: 11/094,782

(22) Filed: Mar. 31, 2005

(65) Prior Publication Data

US 2005/0221547 A1 Oct. 6, 2005

(30) Foreign Application Priority Data

Mar. 31, 2004 (JP) ............................. 2004-107859
Dec. 3, 2004 (JP) ............................. 2004-352010

(51) Int. Cl.
*H01L 21/20* (2006.01)

(52) U.S. Cl. ...................... 438/388; 438/245; 438/270; 438/700; 257/E21.384; 257/E21.428

(58) Field of Classification Search ................ 438/245, 438/269, 388, 389, 390, 418, 429, 524, 576; 257/E21.37, E21.419, E21.428
See application file for complete search history.

(56) References Cited

U.S. PATENT DOCUMENTS

| | | | |
|---|---|---|---|
| 4,466,173 A | 8/1984 | Baliga | |
| 4,754,310 A | 6/1988 | Coe | |
| 6,404,032 B1 | 6/2002 | Kitada et al. | |
| 6,406,982 B2 | 6/2002 | Urakami et al. | |
| 6,495,294 B1 | 12/2002 | Yamauchi et al. | |
| 6,498,368 B2 | 12/2002 | Sakamoto et al. | |
| 6,768,138 B1 | 7/2004 | Kitada et al. | |
| 2001/0048142 A1 | 12/2001 | Urakami et al. | |
| 2002/0140033 A1* | 10/2002 | Bae et al. | 257/347 |
| 2002/0158301 A1 | 10/2002 | Urakami et al. | |
| 2003/0017667 A1 | 1/2003 | Park et al. | |
| 2003/0042555 A1 | 3/2003 | Kitada et al. | |
| 2003/0139012 A1 | 7/2003 | Yamauchi et al. | |
| 2003/0160262 A1 | 8/2003 | Kitada et al. | |
| 2003/0164534 A1 | 9/2003 | Urakami et al. | |
| 2003/0219933 A1 | 11/2003 | Yamauchi et al. | |

(Continued)

FOREIGN PATENT DOCUMENTS

JP          A-56-021386          2/1981

(Continued)

OTHER PUBLICATIONS

U.S. Appl. No. 10/960,286, filed Oct. 8, 2004, Yamauchi et al.

(Continued)

*Primary Examiner*—Savitri Mulpuri
*Assistant Examiner*—Cheung Lee
(74) *Attorney, Agent, or Firm*—Posz Law Group, PLC

(57) ABSTRACT

A method for manufacturing a semiconductor device includes the steps of: forming a trench in a semiconductor substrate; and forming an epitaxial film on the substrate including a sidewall and a bottom of the trench so that the epitaxial film is filled in the trench. The step of forming the epitaxial film includes a final step before the trench is filled with the epitaxial film. The final step has a forming condition of the epitaxial film in such a manner that the epitaxial film to be formed on the sidewall of the trench has a growth rate at an opening of the trench smaller than a growth rate at a position of the trench, which is deeper than the opening of the trench.

18 Claims, 26 Drawing Sheets

U.S. PATENT DOCUMENTS

| | | |
|---|---|---|
| 2003/0224588 A1 | 12/2003 | Yamauchi et al. |
| 2004/0016959 A1 | 1/2004 | Yamaguchi et al. |
| 2004/0185665 A1* | 9/2004 | Kishimoto et al. .......... 438/689 |

FOREIGN PATENT DOCUMENTS

| | | |
|---|---|---|
| JP | A-2000-340578 | 12/2000 |
| JP | A-2002-203963 | 7/2002 |
| JP | A-2002-353451 | 12/2002 |
| JP | A-2003-218037 | 7/2003 |
| JP | A-2003-229569 | 8/2003 |
| JP | A-2003-249651 | 9/2003 |
| JP | A-2004-311673 | 11/2004 |
| JP | A-2005-19898 | 1/2005 |
| WO | WO 2005/020275 | 3/2005 |

OTHER PUBLICATIONS

M. Bartek, "Selective Epitaxial Growth for Smart Silicon Sensor Application", Delft Univ. Press, 1955, pp. 63-70.

First Office Action from Chinese Patent Office issued on Jan. 15, 2007 for the corresponding Chinese patent application No. 2005100600745 (and English translation thereof).

Chinese Office Action issued from Chinese Patent Office dated Jul. 6, 2007 in the corresponding Chinese Patent Application No. 200510060074.5 (and English translation).

Office Action issued from Chinese Patent Office dated Sep. 12, 2008 in corresponding CN Patent Application No. 200510060074.5 (and English Translation).

Office Action dated May 9, 2008 in corresponding Chinese Patent Application No. 200510060074.5 (and English translation).

Office Action dated Apr. 8, 2008 in corresponding German Patent Application No. 10 2005 014 722.4 (and English translation).

* cited by examiner

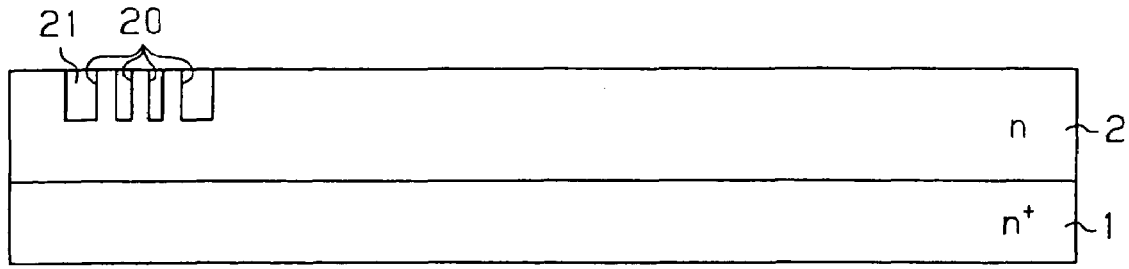
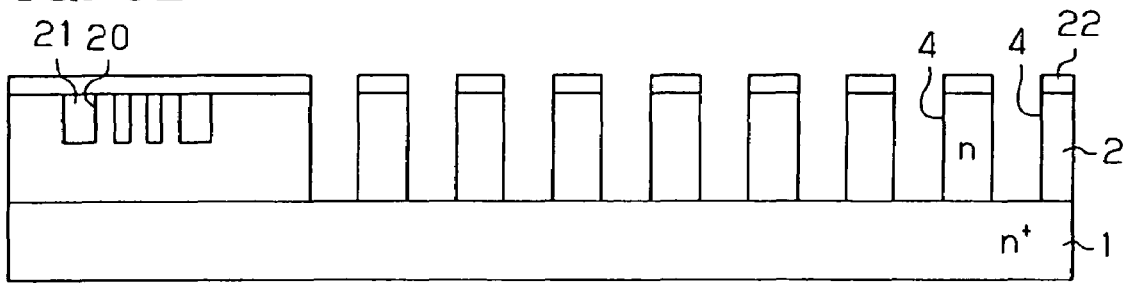
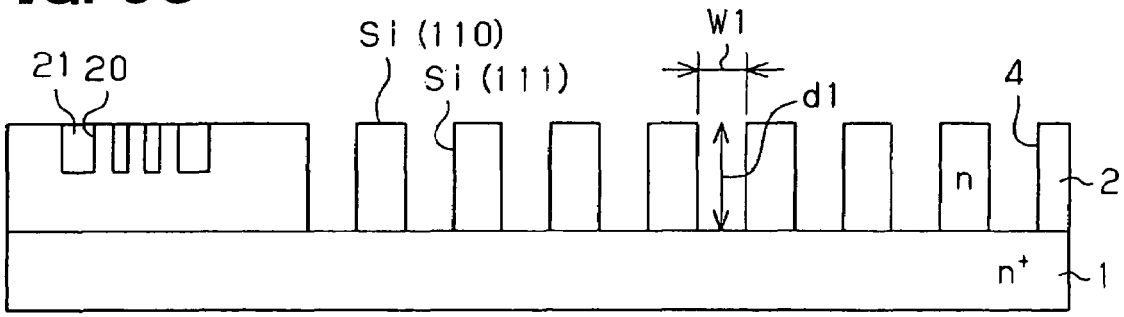
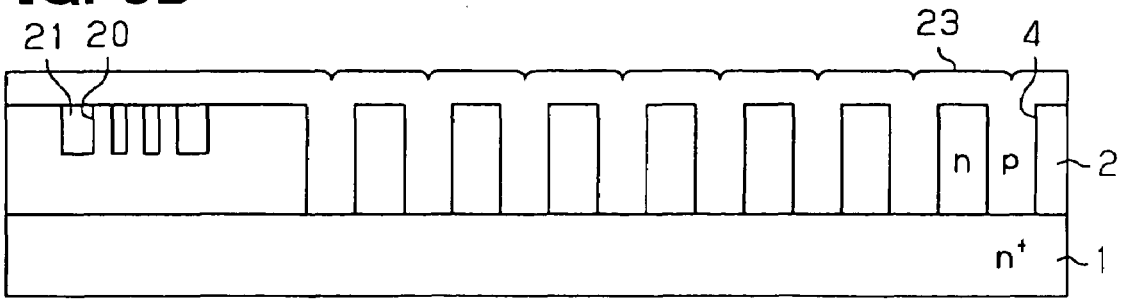

DEPTH : 13 μm

TRENCH WIDTH
3 μm  2 μm  1 μm  0.8 μm  0.5 μm

DEPTH : 13 μm

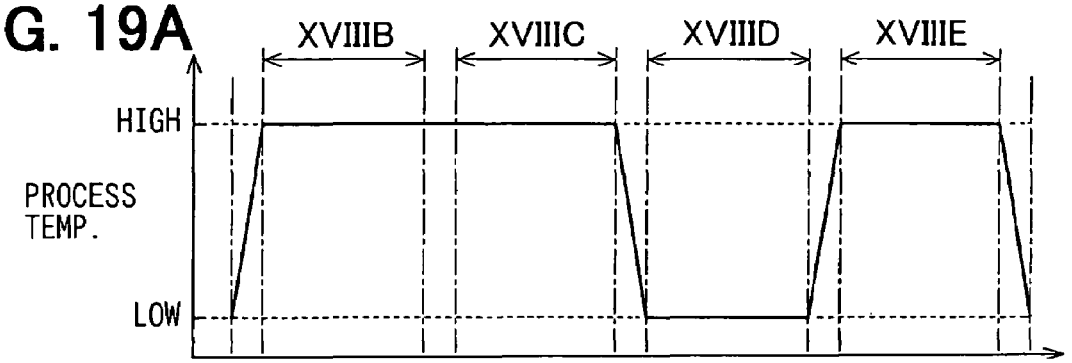
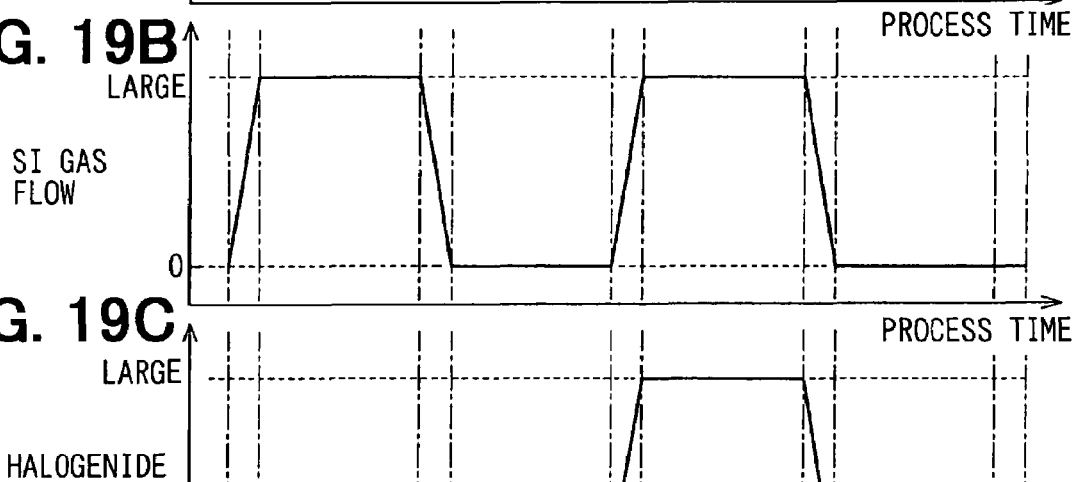
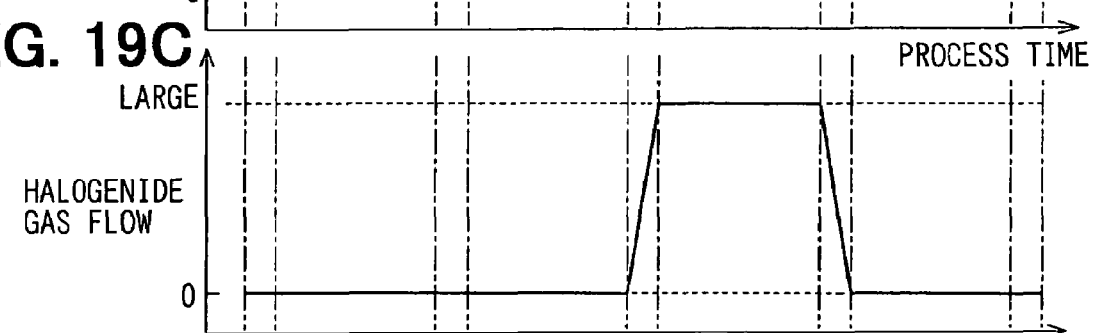
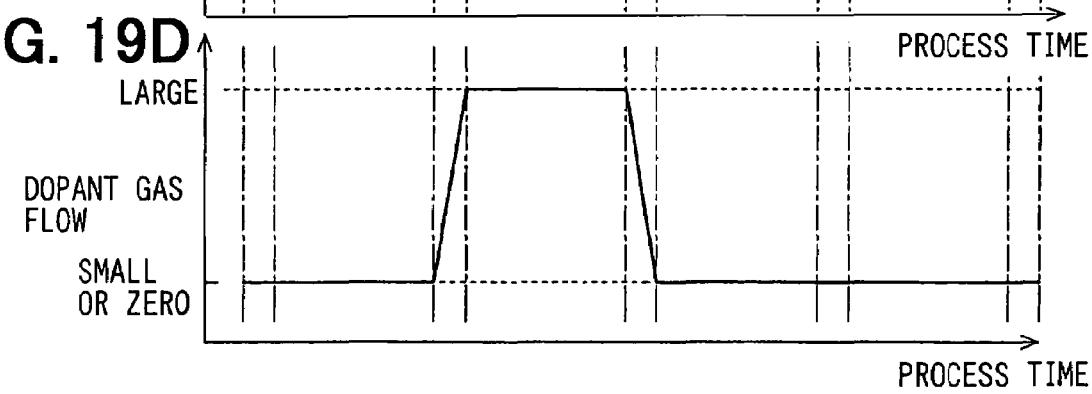

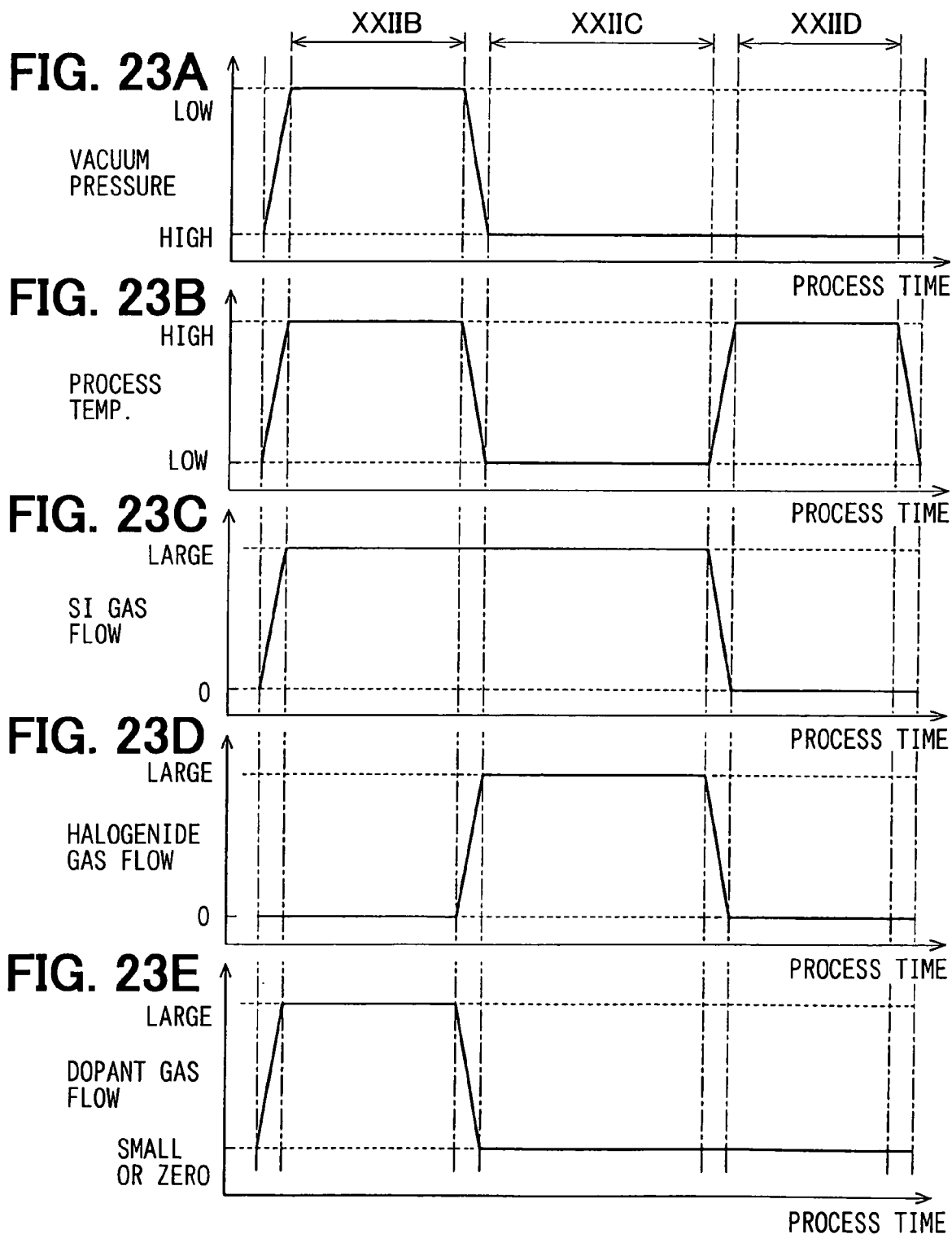

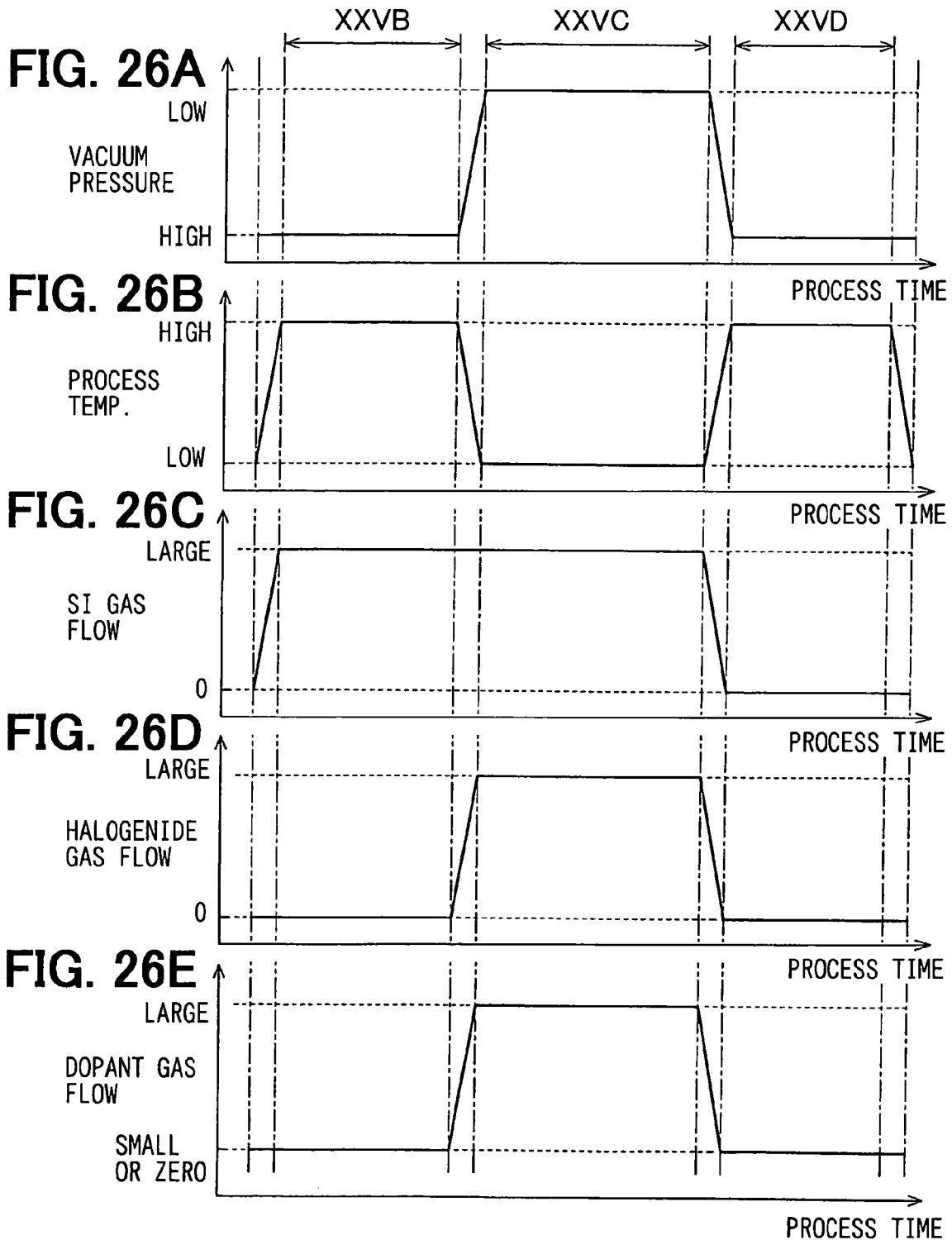

METHOD FOR MANUFACTURING SEMICONDUCTOR DEVICE

CROSS REFERENCE TO RELATED APPLICATIONS

This application is based on Japanese Patent Applications No. 2004-107859 filed on Mar. 31, 2004, and No. 2004-352010 filed on Dec. 3, 2004, the disclosures of which are incorporated herein by reference.

FIELD OF THE INVENTION

The present invention relates to a method for manufacturing a semiconductor device.

BACKGROUND OF THE INVENTION

A method for manufacturing a semiconductor device with a semiconductor substrate by which an epitaxial film is filled in trenches to form a doped layer having a high aspect ratio is disclosed in Japanese Patent No. 3485081. Further, a method for manufacturing a semiconductor substrate by which an epitaxial film is filled in trenches to form a doped layer when a super-junction structure (P/N column structure) is formed in a drift region in a vertical type MOS transistor is disclosed in Japanese Unexamined Patent Publication No. 2003-124464.

In the above device, a P-type silicon layer as an epitaxial film was filled in trenches of an N-type silicon substrate to form a diode structure. In this case, when a defect (i.e., a void) occurs in the epitaxial film filled in the trenches, a breakdown occurs at an upper portion of the void, which results in reducing a breakdown voltage.

In this manner, the influence of defects in the filled epitaxial film reduces the performance of a device. To be more detailed, the influence of defects reduces the breakdown voltage of the above-described super-junction structure (P/N column structure) and produces crystalline defects caused by filled defects (voids) to reduce a breakdown/junction leakage current yield and leaves resist in the portions of defects in the trenches to cause contamination in the process.

SUMMARY OF THE INVENTION

In view of the above-described problem, it is an object of the present invention to provide a method for manufacturing a semiconductor device with a semiconductor substrate. The substrate includes an epitaxial film filled in a trench with void-less structure.

A method for manufacturing a semiconductor device includes the steps of: forming a trench in a semiconductor substrate; and forming an epitaxial film on the substrate including a sidewall and a bottom of the trench so that the epitaxial film is filled in the trench. The step of forming the epitaxial film includes a final step before the trench is filled with the epitaxial film. The final step has a forming condition of the epitaxial film in such a manner that the epitaxial film to be formed on the sidewall of the trench has a growth rate at an opening of the trench smaller than a growth rate at a position of the trench, which is deeper than the opening of the trench.

In the above method, the growth rate of the epitaxial film at the opening of the trench is lower than that at a position of the trench deeper than the opening of the trench. Therefore, the epitaxial film is prevented from closing the opening of the trench so that the epitaxial film is filled in the trench without any void. Thus, the above method provides the substrate including the epitaxial film filled in the trench with void-less structure.

Further, a method for manufacturing a semiconductor device includes the steps of: forming a trench in a semiconductor substrate; and forming an epitaxial film on the substrate including a sidewall and a bottom of the trench so that the epitaxial film is filled in the trench. The step of forming the epitaxial film includes a final step before the trench is filled with the epitaxial film. The final step has a forming condition of the epitaxial film in such a manner that a mixture of a silicon source gas and a halogenide gas is used for forming the epitaxial film.

In the above method, the halogenide gas works as an etching gas, and the etching rate of the halogenide gas is controlled by supply of the gas. Therefore, the etching rate of the epitaxial film at the opening of the trench is higher than that at a position of the trench deeper than the opening of the trench. Thus, the growth rate of the epitaxial film at the opening of the trench is lower than that at a position of the trench deeper than the opening of the trench. Therefore, the epitaxial film is prevented from closing the opening of the trench so that the epitaxial film is filled in the trench without any void. Thus, the above method provides the substrate including the epitaxial film filled in the trench with void-less structure.

Preferably, the step of forming the epitaxial film further includes a first step and an etching step. The first step is such that the epitaxial film is formed on the bottom and the sidewall of the trench to have a predetermined thickness. The etching step is such that a part of the epitaxial film at an opening of the trench is etched by the halogenide gas so that the opening of the trench is enlarged. More preferably, the final step has a second forming condition of the epitaxial film in such a manner that the epitaxial film is formed under a control of a chemical reaction. More preferably, the first step is performed under a predetermined vacuum pressure lower than that of the final step. Furthermore preferably, the predetermined vacuum pressure of the first step is in a range between 1000 Pa and $1 \times 10^{-3}$ Pa.

Preferably, the step of forming the epitaxial film further includes a first step. The first step is such that the epitaxial film having an impurity doped in the epitaxial film is formed on the bottom and the sidewall of the trench to have a predetermined thickness. The final step is such that the epitaxial film having no impurity doped or a low concentration impurity doped in the epitaxial film is formed to fill an inside of the trench. The low concentration impurity of the epitaxial film in the final step has an impurity concentration lower than that in the first step. In this case, the epitaxial film is filled in the trench with void-less structure, and further, the impurity in the epitaxial film can be formed uniformly.

Preferably, the step of forming the epitaxial film further includes a first step and a vapor phase diffusion step. The first step is such that the epitaxial film having an impurity doped in the epitaxial film is formed on the bottom and the sidewall of the trench to have a predetermined thickness. The vapor phase diffusion step is such that an impurity is doped from a surface of the epitaxial film by a vapor phase diffusion method to form an impurity doped region in the epitaxial film. The final step is such that the epitaxial film having no impurity doped or a low concentration impurity doped in the epitaxial film is formed to fill an inside of the trench. The low concentration impurity of the epitaxial film in the final step has an impurity concentration lower than that in the first step. In this case, the epitaxial film is filled in the trench with void-less structure, and further, the impurity in the epitaxial film can be formed uniformly.

Preferably, the step of forming the epitaxial film further includes a vapor phase diffusion step. The vapor phase diffusion step is such that an impurity is doped from the bottom and the sidewall of the trench by a vapor phase diffusion method to form an impurity doped region in the bottom and the sidewall of the trench. The final step is such that the epitaxial film having no impurity doped or a low concentration impurity doped in the epitaxial film is formed to fill an inside of the trench. The low concentration impurity of the epitaxial film in the final step has an impurity concentration lower than that in the impurity doped region of the bottom and the sidewall of the trench. In this case, the epitaxial film is filled in the trench with void-less structure, and further, the impurity in the epitaxial film can be formed uniformly.

Preferably, the step of forming the epitaxial film further includes a first step. The first step is such that the epitaxial film having no impurity doped or an impurity doped in the epitaxial film is formed on the bottom and the sidewall of the trench to have a predetermined thickness. The final step is such that the epitaxial film having a high concentration impurity doped in the epitaxial film is formed to fill an inside of the trench. The high concentration impurity of the epitaxial film in the final step has an impurity concentration higher than that in the first step. The final step is performed under a predetermine vacuum pressure lower than that of the first step. In this case, the epitaxial film is filled in the trench with void-less structure, and further, the impurity in the epitaxial film can be formed uniformly.

BRIEF DESCRIPTION OF THE DRAWINGS

The above and other objects, features and advantages of the present invention will become more apparent from the following detailed description made with reference to the accompanying drawings. In the drawings:

FIGS. 3A to 3D are cross sectional views explaining a method for manufacturing the MOSFET according to the first embodiment;

FIGS. 19A to 19D are timing charts showing process conditions of the manufacturing method in each process, according to the fourth embodiment;

FIGS. 23A to 23E are timing charts showing process conditions of the manufacturing method in each process, according to the sixth embodiment;

FIGS. 26A to 26E are timing charts showing process conditions of the manufacturing method in each process, according to the seventh embodiment.

DETAILED DESCRIPTION OF THE PREFERRED EMBODIMENTS

First Embodiment

Figure 27A:
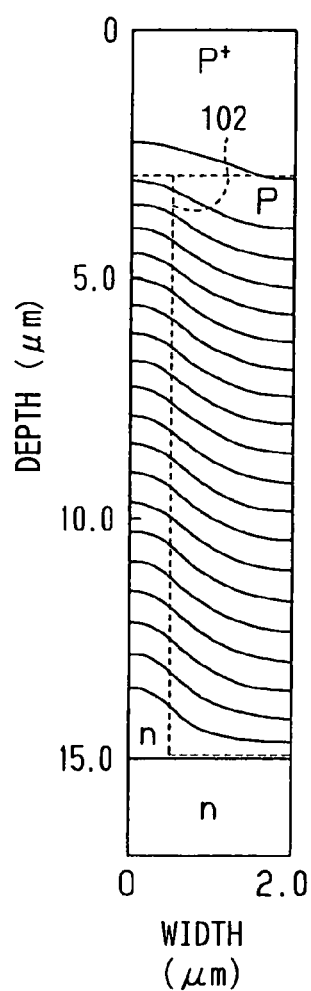
FIGS. 27A and 27B are cross sectional views showing an electric potential distribution and an impact ionization ratio distribution in a device with void-less structure.
Figure 27B:
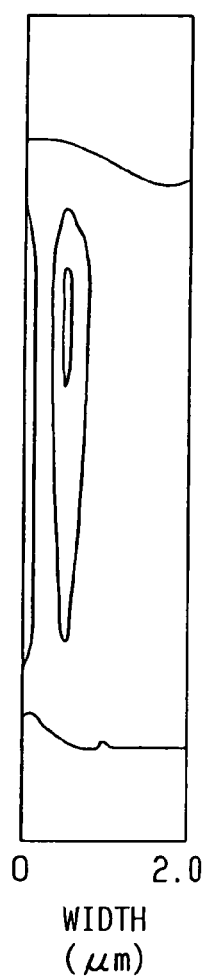
Figure 27C:
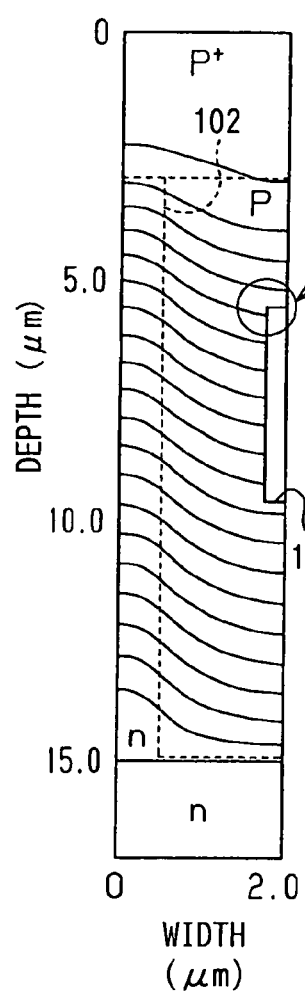
FIGS. 27C and 27D are cross sectional views showing an electric potential distribution and an impact ionization ratio distribution in a device with a void, according to a comparison of the first embodiment.
Figure 27D:
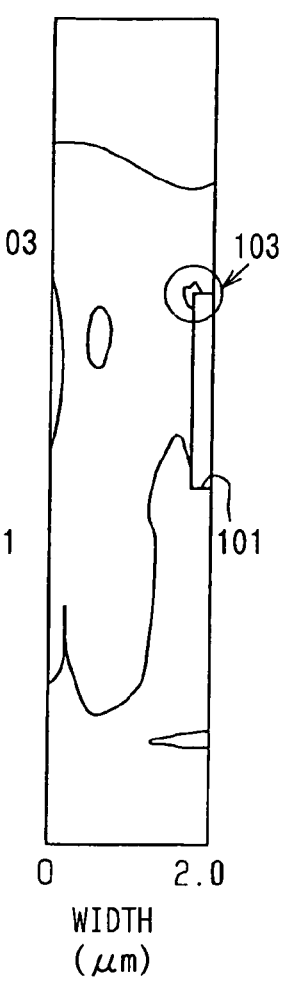

The inventors performed a simulation relating to a breakdown voltage when P-type silicon was filled in the trenches of an N-type silicon substrate to form a diode structure. The results of simulation are shown in FIGS. 27A to 27D. FIGS. 27A and 27B show the substrate having void-less structure, and FIGS. 27C and 27D show the substrate having void structure. FIGS. 27A and 27C show electric potential distributions, and FIGS. 27B and 27D show a distribution of an impact ionization ratio. When a defect (i.e., a void) does not occur in an epitaxial film filled in the trenches, a potential distribution and an impact ionization ratio shown in FIGS. 27A and 27B are obtained and a breakdown voltage of 248 V can be secured. However, when a defect (i.e., a void) 101 occurs in the epitaxial film filled in the trenches 102, as shown in FIGS. 27C and 27D, a breakdown occurs at an upper portion 103 of the void 101, which results in reducing a breakdown voltage to 201 V.

In this manner, the influence of defects in the filled epitaxial film reduces the performance of a device. To be more detailed, the influence of defects reduces the breakdown voltage of the above-described super-junction structure (P/N column structure) and produces crystalline defects caused by filled defects (voids) to reduce a breakdown/junction leakage current yield and leaves resist in the portions of defects in the trenches to cause contamination in the process.

In view of the above problem a method for manufacturing a semiconductor device with a semiconductor substrate by which a new construction can prevent trench openings from being closed by an epitaxial film to improve the filling of the trenches.

Figure 1:
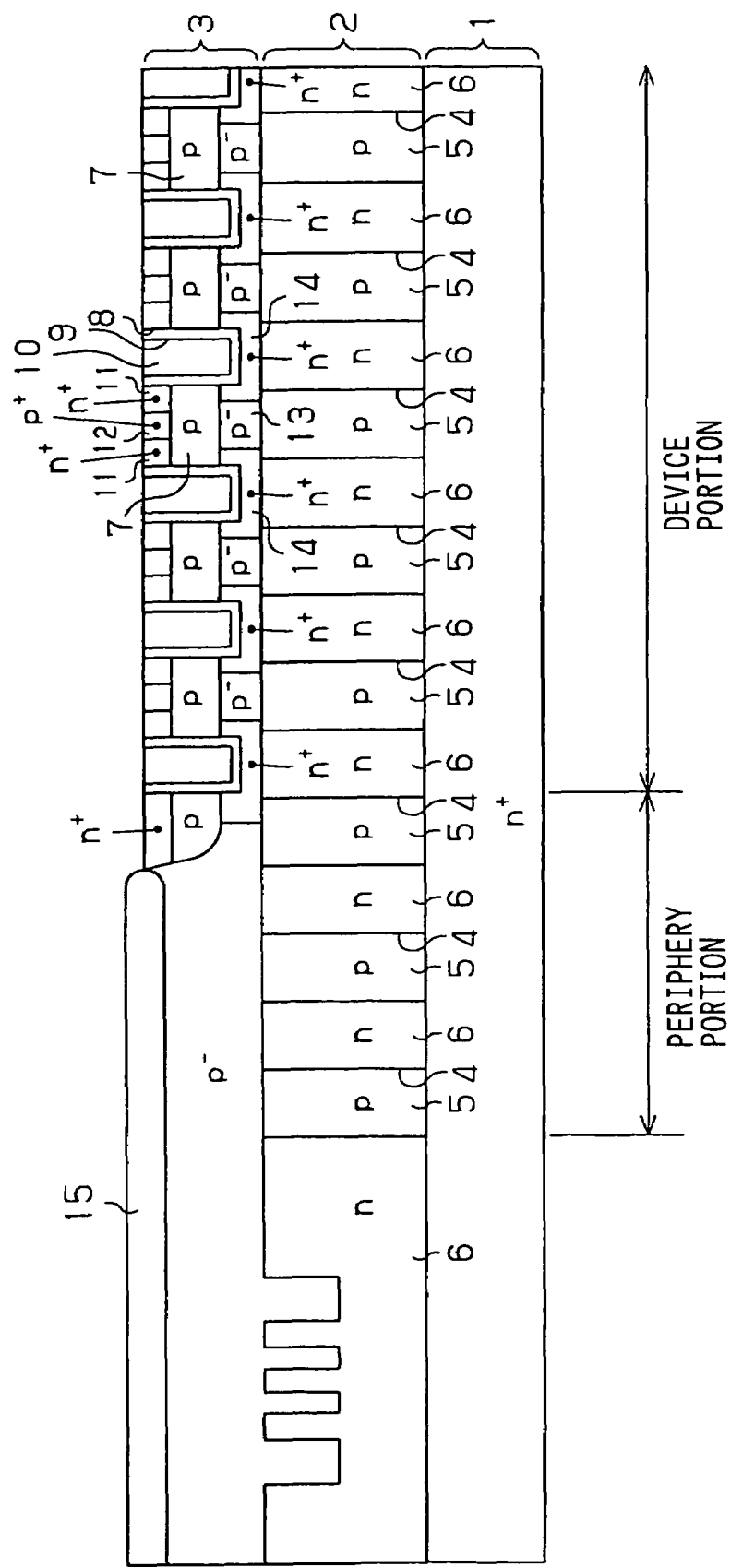
FIG. 1 is a cross sectional view showing a vertical trench gate MOSFET according to a first embodiment of the present invention.
Figure 2:
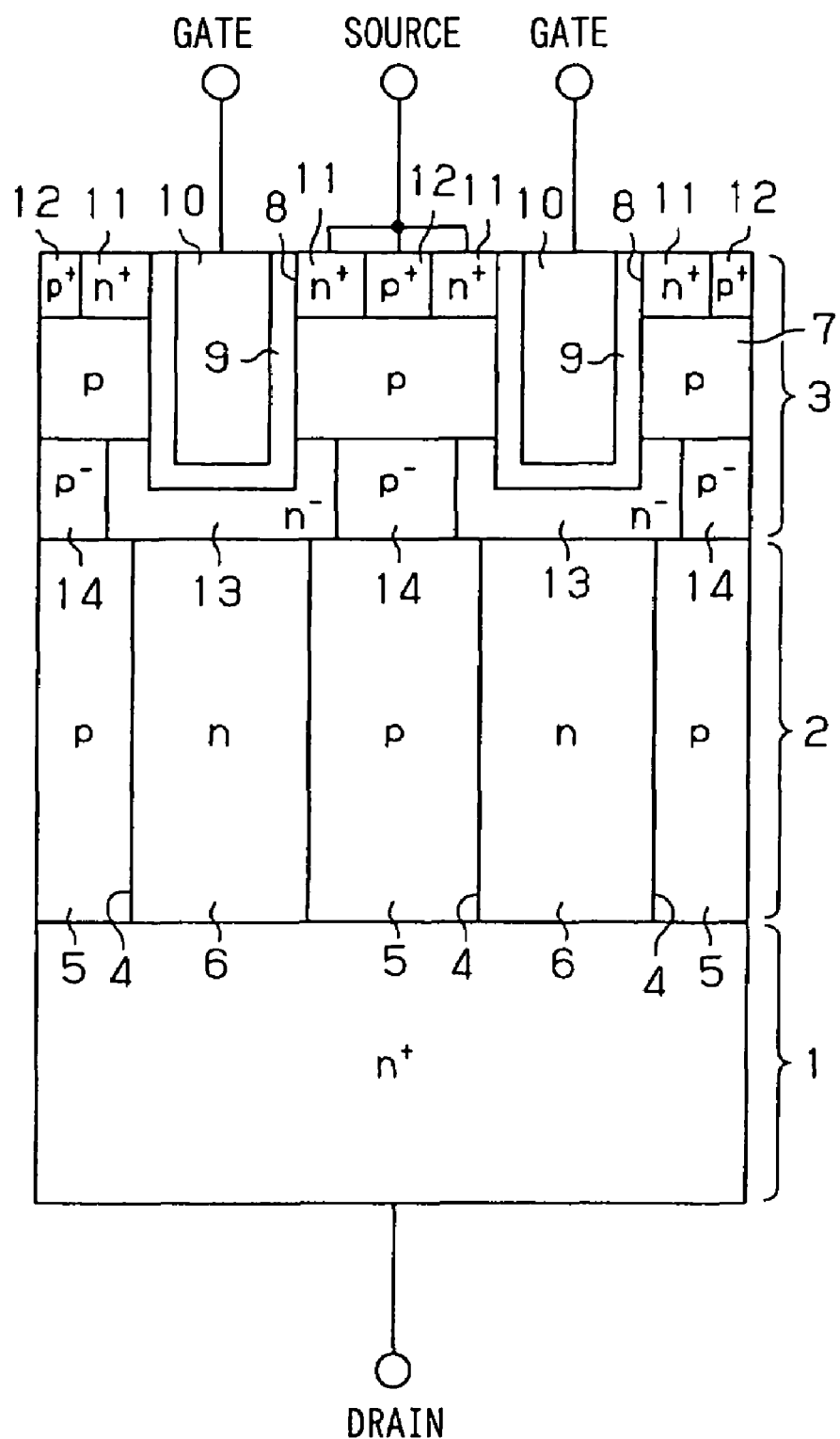
FIG. 2 is a partially enlarged cross sectional view showing a device portion of the MOSFET according to the first embodiment.

For example, a vertical type trench gate MOSFET is manufactured by the method according to the first embodiment. FIGS. 1 and 2 show the MOSFET device and a main portion of the device.

In FIG. 2, an epitaxial film 2 is formed over an $n^+$ silicon substrate 1 to be a drain region and an epitaxial film 3 is formed over the epitaxial film 2. Trenches 4 are formed in parallel in the lower epitaxial film 2. The trenches 4 pass through the epitaxial film 2 and reach the $n^+$ silicon substrate 1. An epitaxial film 5 is filled in the trenches 4. The conduction type of the epitaxial film 5 filled in the trench 4 is p type and the conduction type of a region 6 adjacent to the trench 4 is n type. In this manner, p type regions 5 and n type regions 6 are alternately arranged to make the so-called super-junction structure in which the drift layer of MOSFET forms a p/n column structure.

In the upper epitaxial film 3, a p well layer 7 is formed in the surface layer. Trenches 8 for gates are formed in parallel in the epitaxial film 3 and the trenches 8 are formed more deeply than the p well layer 7. A gate oxide film 9 is formed on the inside surface of each of the trenches 8 and a polysilicon gate electrode 10 is arranged in the gate oxide film 9. An $n^+$ source region 11 is formed in a surface layer at a portion in contact with each of the trenches 8 on the top surface of the epitaxial film 3. Further, a $p^+$ source contact region 12 is formed in the surface layer on the top surface of the p type epitaxial film 3. Still further, an $n^-$ buffer region 13 is formed in each of the trenches 8 between the p well layer 7 of the epitaxial film 3 and the epitaxial film 2 (drift layer). The $n^-$ buffer region 13 includes the bottom portion of the trench 8 and is in contact with the n type region 6 in the drift layer and the p well layer 7. A $p^-$ region 14 is formed between the $n^-$ buffer regions 13 of the respective trenches 8.

A drain electrode (not shown) is formed on the bottom surface of the $n^+$ silicon substrate 1 and is electrically connected to the $n^+$ silicon substrate 1. Further, a source electrode (not shown) is formed on the top surface of the epitaxial film 3 and is electrically connected to the $n^+$ source region 11 and the $p^+$ source contact region 12.

When a predetermined positive voltage is applied as a gate electric potential between the source and the drain with a source voltage at a ground voltage and a drain voltage at a positive voltage, a transistor is brought into ON state. When the transistor is brought into the ON state, a conversion layer is formed in a portion in contact with the gate oxide film 9 of the p well layer 7 and electrons pass between the source and the drain through this conversion layer (i.e., the electrons passes through the $n^+$ source region 11, the p well layer 7, the $n^-$ buffer region 13, the n type region 6, and the $n^+$ silicon substrate 1). Further, when a reverse bias voltage is applied (source voltage is at a ground voltage and the drain voltage is at a positive voltage), depletion layers extend from a pn junction between the p type region 5 and the n type region 6, a pn junction between the $n^-$ buffer region 13 and the $p^-$ buffer region 14, a pn junction between the $n^-$ buffer region 13 and the p well region 7, whereby the p type region 5 and the n type region 6 are depleted to increase a breakdown voltage.

On the other hand, in FIG. 1, the n type regions 6 and the p type regions 5 are alternately arranged in the lateral direction also in the end portion around a device portion. Further, a LOCOS (i.e., local oxidation of silicon) oxide film 15 is formed on the outer peripheral side of the device portion on the top surface of the epitaxial film 3.

Next, a method for manufacturing a vertical type trench gate MOSFET in this embodiment will be described. First, as shown in FIG. 3A, an $n^+$ silicon substrate 1 is prepared and an n type epitaxial film 2 is formed over the $n^+$ silicon substrate 1. A plurality of trenches 20 are formed in the epitaxial film 2 in the outer peripheral portion of a chip and a silicon oxide film 21 is filled into the trenches 20. Then, the top surface of the epitaxial film 2 is planarized.

Then, as shown in FIG. 3B, a silicon oxide film 22 is formed over the n type epitaxial film 2 and is patterned in a predetermined shape so as to form predetermined trenches. Then, the epitaxial film 2 is anisotropically etched (RIE) by using the silicon oxide film 22 as a mask, or is wet-etched by an alkaline anisotropic etching liquid (such as KOH, TMAH) to form trenches 4 reaching the silicon substrate 1. In this manner, the trenches 4 are formed in the silicon substrate formed of the $n^+$ silicon substrate 1 and the epitaxial film 2.

Further, as shown in FIG. 3C, the silicon oxide film 22 used as the mask is removed. At this time, the aspect ratio (=d1/W1) of the trench 4 is 2 or more. Further, a silicon substrate having a (110)-surface orientation is used and the top surface of the epitaxial film 2 is made to have a (110)-surface orientation and the side surface of the trench 4 is made to have a (111)-surface orientation. Alternatively, a silicon substrate having a (100)-surface orientation is used and the top surface of the epitaxial film 2 is made to have a (100)-surface orientation and the side surface of the trench 4 is made to have a (100)-surface orientation.

Then, as shown in FIG. 3D, an epitaxial film 23 is formed over the epitaxial film 2 including the inner surfaces of the trenches 4, whereby the trenches 4 are filled by the epitaxial film 23. In the step of filling the epitaxial film 23 in the trenches 4, a mixed gas of a silicon source gas and a halogenide gas is used as gas supplied to the silicon substrate so as to form the epitaxial film 23. To be specific, any one of monosilane ($SiH_4$), disilane ($Si_2H_6$), dichlorosilne ($SiH_2Cl_2$), trichlorosilane ($SiHCl_3$), and silicon tetrachloride ($SiCl_4$) is used as a silicon source gas. In particular, it is recommendable to use any one of dichlorosilne ($SiH_2Cl_2$), trichlorosilane ($SiHCl_3$), and silicon tetrachloride ($SiCl_4$) as a silicon source gas. Any one of hydrogen chloride (HCl), chlorine ($Cl_2$), fluorine ($F_2$), chlorine trifluoride ($ClF_3$), hydrogen fluoride (HF), and hydrogen bromide (HBr) is used as a halogenide gas.

Further, the epitaxial film 23 is formed under a control of a chemical reaction condition. In particular, when monosilane or disilane is used as the silicon source gas, the upper limit of a film forming temperature is set at 950° C. When dichrosilane is used as the silicon source gas, the upper limit of a film forming temperature is set at 1100° C. When trichlorosilane is used as the silicon source gas, the upper limit of a film forming temperature is set at 1150° C. When silicon tetrachloride is used as the silicon source gas, the upper limit of a film forming temperature is set at 1200° C. Further, when the vacuum pressure of forming a film is within a range from atmospheric pressure to 100 Pa, the lower limit of a film forming temperature is set at 800° C. When the vacuum pressure of forming a film is within a range from 100 Pa to $1\times10^{-5}$ Pa, the lower limit of a film forming temperature is set at 600° C. It was examined by experiment that this condition can grow the epitaxial film without causing crystalline defects.

Figure 4A:
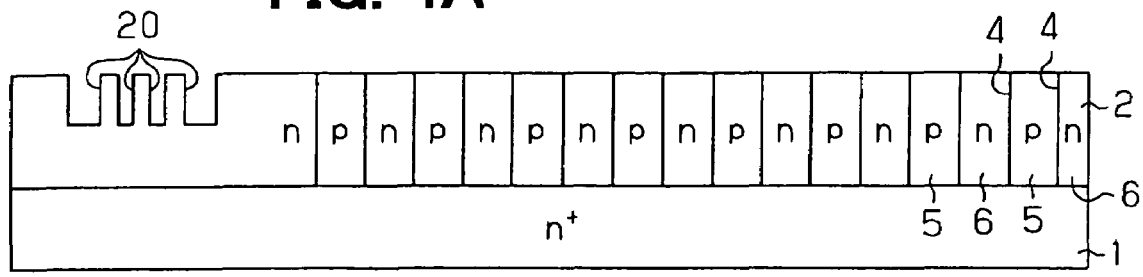
FIGS. 4A to 4D are cross sectional views explaining the method for manufacturing the MOSFET according to the first embodiment.

Thereafter, the top surface of the epitaxial film 23 is planarized to expose the epitaxial film (n type silicon layer) 2, as shown in FIG. 4A. With this, the p type regions 5 and the n type regions 6 are alternately arranged in the lateral direction. Further, the silicon oxide film 21 in the trenches 20 in the outer peripheral portion of the chip (see FIG. 3D) is removed.

Figure 4B:
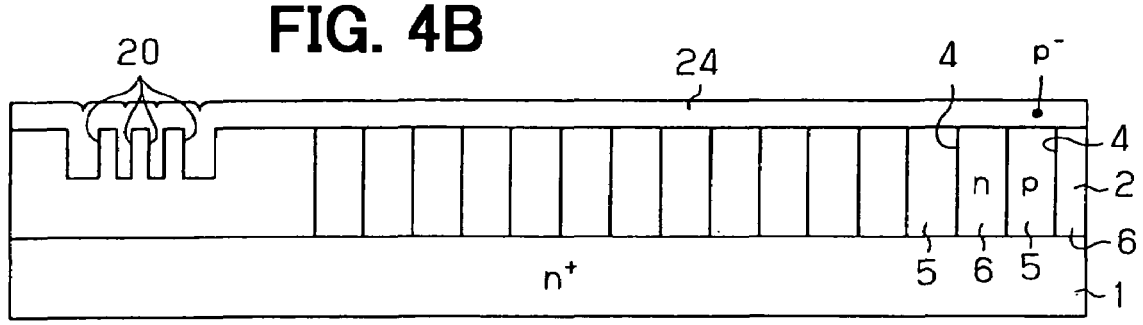
Figure 4C:
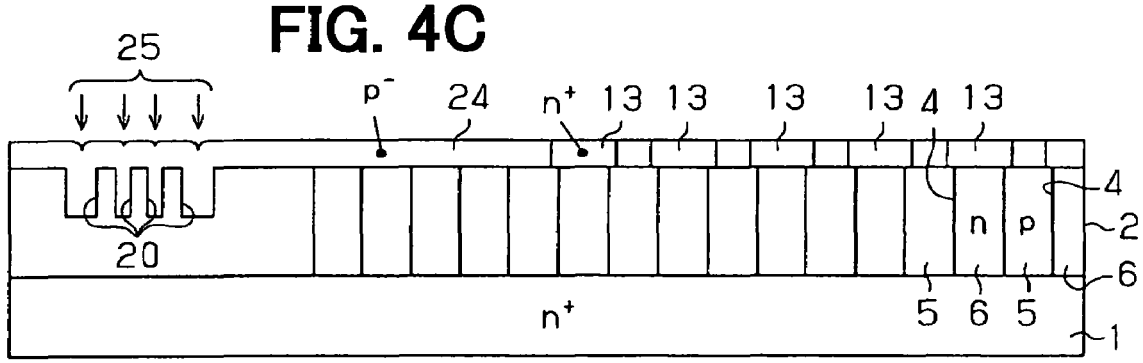

Then, as shown in FIG. 4B, a $p^-$ type epitaxial film 24 is formed over the epitaxial film 2. Further, as shown in FIG. 4C, the $n^-$ buffer regions 13 are formed by ion implantation in portions in contact with the n type regions 6 in the $p^-$ type epitaxial film 24. At this time, concavities 25 are formed on the top surface of the epitaxial film 24 in the trench 20 formed in the outer peripheral portion of the chip and a photo mask is aligned by using the concavities 25 as alignment marks.

Figure 4D:
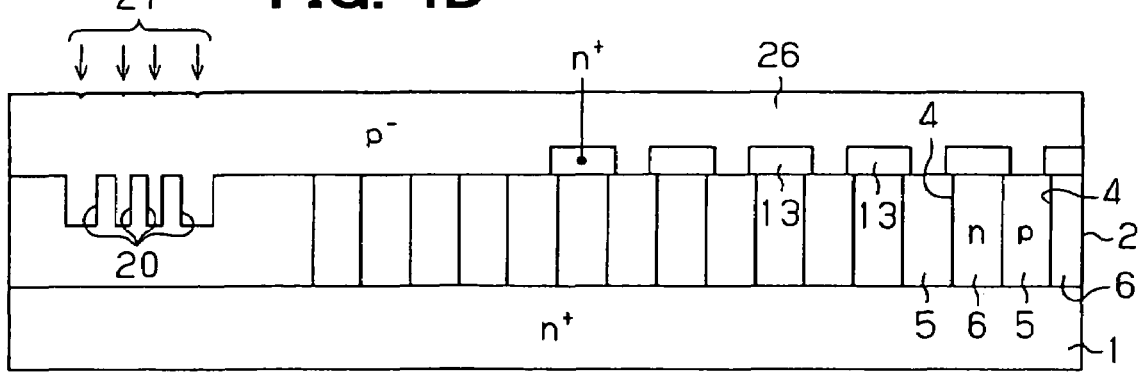

Then, as shown in FIG. 4D, a $p^-$ type epitaxial film 26 is formed over the $p^-$ type epitaxial film 24.

Then, as shown in FIG. 1, the LOCOS oxide film 15 is formed. Further, the p well layer 7, the trench 8, the gate oxide film 9, the polysilicon gate electrode 10, the $n^+$ source region 11, and the $p^+$ source contact region 12 are formed. Further, electrodes and wirings are formed in the device portion. When the $n^+$ source region 11 and the $p^+$ source contact region 12 are formed by ion implantation in the forming of the device portion, concavities 27 are formed on the top surface of the epitaxial film 26 in the trench 20 formed in the outer peripheral portion of the chip and a photo mask is aligned by using the concavities 27 as alignment marks.

In this regard, the mixed gas of a silicon source gas and a halogenide gas is used as gas supplied to the silicon substrate (1, 2) so as to form the epitaxial film 23, after the trenches 4 are formed in the silicon substrate (1, 2), from the start of forming the epitaxial film 23 until the filling of the epitaxial film 23 in the trenches 4. However, in a broad sense, it is essential only that the mixed gas of a silicon source gas and a halogenide gas is used as gas supplied to the silicon substrate (1, 2) so as to form the epitaxial film 23 at least at the final step of filling in the process of filling the epitaxial film 23 in the trenches 4.

In the manufacturing process like this, a step of filling an epitaxial film, as shown in FIGS. 3C and 3D, will be described in detail by the use of FIGS. 5A, 5B, and 5C.

Figure 5A:
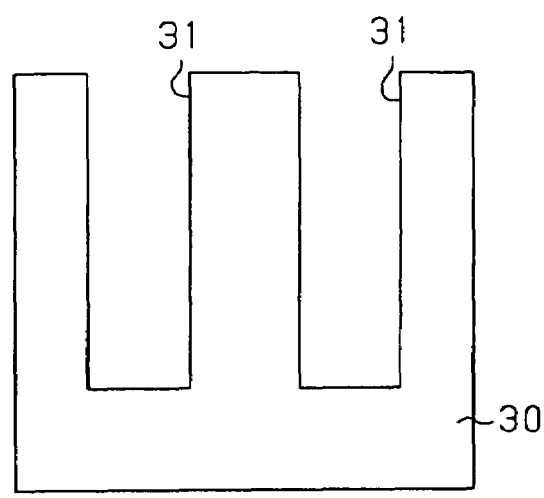
FIGS. 5A to 5C are partially enlarged cross sectional views explaining the method for manufacturing the MOSFET according to the first embodiment.
Figure 5B:
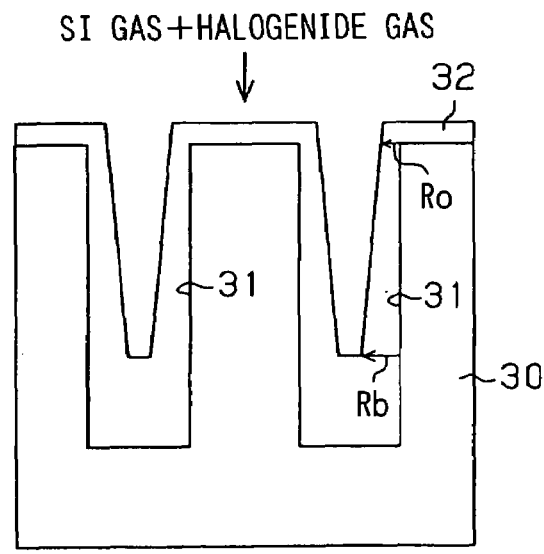
Figure 5C:
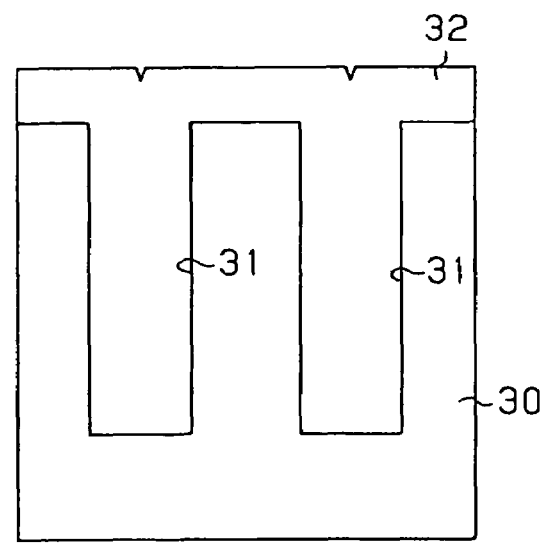

As shown in FIG. 5A, trenches 31 are formed in the silicon substrate 30 and then, as shown in FIG. 5C, an epitaxial film 32 is filled in the trenches 31. At this time, as shown in FIG. 5B, as a condition for forming the epitaxial film 32, the growth rate of the epitaxial film 32 growing on the side surface of the trench is made slower at a trench opening than at a portion deeper than the trench opening. In other words, when it is assumed that the growth rate at the trench opening is defined as R0 and that the growth rate at a portion deeper than the trench opening is defined as Rb, the growth rates R0, Rb have a relationship as "R0<Rb."

In this manner, the epitaxial film is formed in the trenches in such a way that a film thickness is thinner at the trench opening than at the trench bottom. With this, the film thickness of the epitaxial film on the side surface of the trench is made thinner at the trench opening than at the trench bottom, whereby the epitaxial film can be formed in a state free of voids. In short, since the epitaxial film can be formed in a state free of voids, when a reverse bias voltage is applied to the super-junction structure (p/n column structure) (source is at a ground voltage and drain is at a plus voltage), it is possible to secure a breakdown voltage and to prevent a junction leakage current. Further, it is possible to eliminate voids (reduce the sizes of voids), to improve a breakdown voltage yield, and to improve a junction leakage current yield.

For this reason, as described above, the following conditions [A] to [E] are set up.

[A] A mixed gas of a silicon source gas and a halogenide gas is used as gas supplied to the silicon substrate so as to form the epitaxial film 23.

[B] The epitaxial film 23 is formed under a control of a chemical reaction condition.

[C] The epitaxial film is filled in the trenches after the oxide film, which is used as a mask when the trenches are formed by etching, is removed.

[D] The bottom surface of the trench has the (110)-surface orientation and the side surface of the trench has the (111)-surface orientation. Alternatively, the bottom surface of the trench has the (100)-surface orientation and the side surface of the trench has the (100)-surface orientation.

[E] The aspect ratio of the trench is 2 or more.

Hereafter, the reason why these conditions [A] to [E] are set up will be described.

First, the reason of the condition [A], that is, the reason why the epitaxial film is formed by the use of the mixed gas of a silicon source gas and a halogenide gas will be described.

Assuming that the epitaxial growth at the trench opening and at a portion (portion in the trench) is deeper than the trench opening.

Defects (voids) in the filling of epitaxial film are caused by the fact that the amount of epitaxial film formed near the trench opening becomes relatively larger than the amount of epitaxial film formed in the trench, whereby the trench opening is earlier closed to leave voids in the trench. It is the main factor for increasing the amount of epitaxial film formed at the trench opening that the amount of supply of the silicon source gas at the trench opening is relatively larger than the amount of supply of the silicon source gas in the trench. A mixed gas of a silicon source gas and a halogenide gas is used as a measure against this factor.

Figure 6:
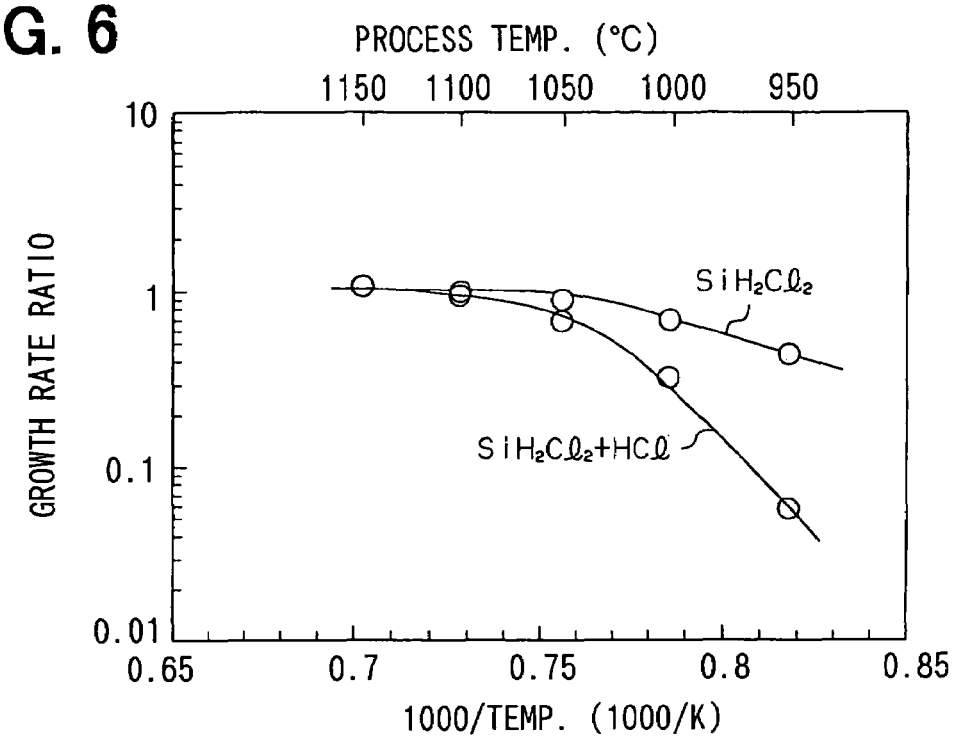
FIG. 6 is a graph explaining a relationship between a growth rate ratio and a process temperature with and without HCl gas, according to the first embodiment.

The halogenide gas functions as an etching gas and an etching rate are determined by supply and the etching rate is larger at the trench opening than in the trench. In other words, an etching reaction by halogenide is more remarkable at the trench opening than in the trench, so that the trench is etched in the tapered shape. Describing the etching reaction by the use of FIG. 6, as can be seen from the drawing, the growth rate is decreased by using a mixed gas of dichlorosilane ($SiH_2Cl_2$) and hydrogen chloride (HCl) as compared with the growth rate when dichlorosilane ($SiH_2Cl_2$) is used. Further, as for the action of a halogenide gas, the halogenide gas relates to the decomposing reaction of a silicon source gas to make reaction mechanism complex to accelerate control of a chemical reactionlability. This will be described by the use of FIG. 6. When a maximum temperature at which the control of a chemical reaction develops in the use of dichlorosilane ($SiH_2Cl_2$) is compared with a maximum temperature at which the control of a chemical reaction develops in the use of a mixed gas of dichlorosilane and a hydrogen chloride gas, a chemical reaction control region can be shifted to a higher temperature side by forming the epitaxial film by the use of the mixed gas of dichlorosilane and a hydrogen chloride gas (mixed gas of a silicon source gas and a halogenide gas).

In this regard, an epitaxial film can be filled in the trenches under a supply control condition. In this case, as described above, the amount of supply of silicon source gas is increased at a portion closer to the trench opening to cause a film thickness distribution, but an etching action by the mixed halogenide gas can prevent the film thickness distribution in the form of closing structure on opening portion.

Next, the forming of the epitaxial film to be filled in the trenches under a control of a chemical reaction condition as described in [B] will be described.

By forming the epitaxial film under the condition in which the formation of a film is determined by reaction, a film thickness distribution is resistant to the effect of a gas supply distribution. Hence, it is possible to prevent the amount of supply of silicon source gas from being larger than the amount of supply of silicon source gas in the trench and hence to prevent voids from remaining in the trench when the epitaxial film is formed.

Figure 7:
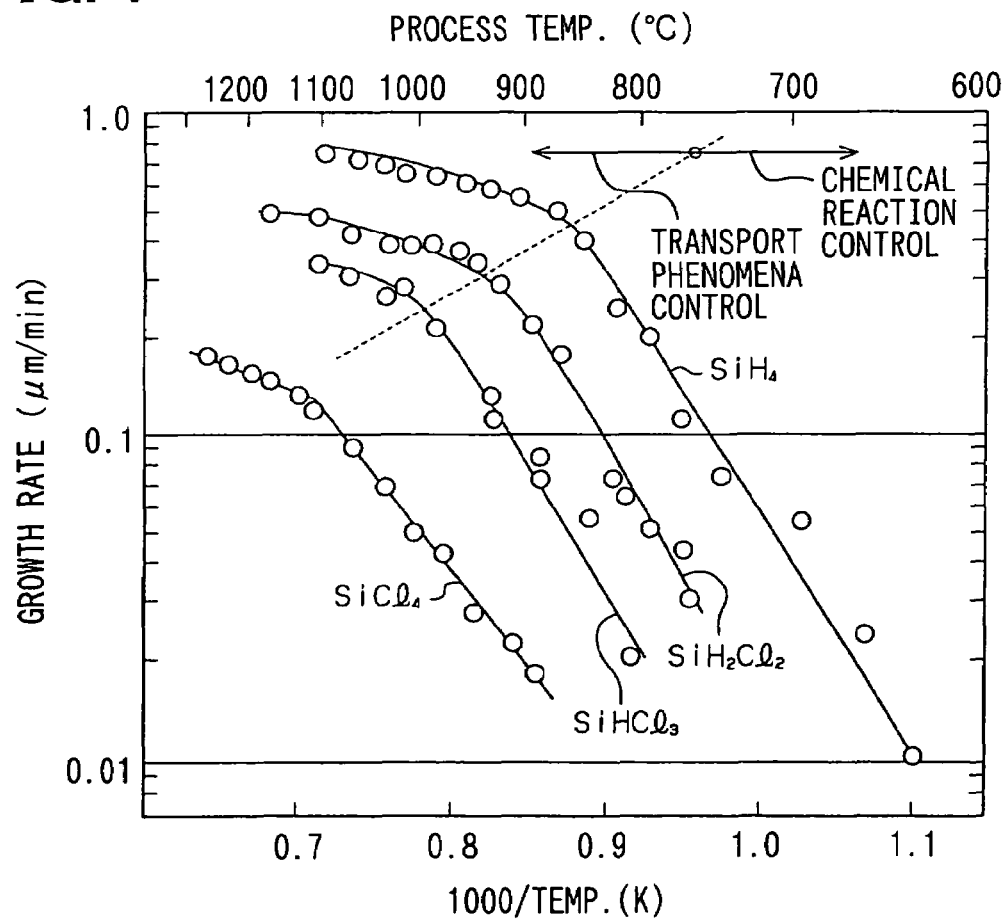
FIG. 7 is a graph explaining a relationship between a growth rate and a process temperature with using different gases, according to the first embodiment.

To set up the condition in which the formation of a film is determined by reaction, as shown in FIG. 7, the epitaxial film is formed at lower temperatures. Any one of monosilane ($SiH_4$), disilane ($Si_2H_6$), dichlorosilne ($SiH_2Cl_2$), trichlorosilane ($SiHCl_3$), and silicon tetrachloride ($SiCl_4$) can be used as a silicon source gas. At this time, when the epitaxial film is formed at a lower temperature, there is apprehension that crystallinity becomes worse. On this account, by using dichlorosilne ($SiH_2Cl_2$), trichlorosilane ($SiHCl_3$), or silicon tetrachloride ($SiCl_4$) as a silicon source gas, a growth temperature can be shifted to a higher temperature side. With this, a maximum temperature under the condition in which the formation of a film is determined by reaction can be shifted to a higher temperature side as compared with a case where monosilane ($SiH_4$) or disilane ($Si_2H_6$) is used. In other words, the temperature range of a chemical reaction control can be expanded to a higher temperature by using dichlorosilne ($SiH_2Cl_2$) having an enthalpy of formation of 578 kJ/mol, trichlorosilane ($SiHCl_3$) having an enthalpy of formation of 670 kJ/mol, or silicon tetrachloride ($SiCl_4$) having an enthalpy of formation of 763 kJ/mol, as compared with monosilane ($SiH_4$) having an enthalpy of formation of 417 kJ/mol. For this reason, the epitaxial film can be formed under a control of a chemical reaction control condition in higher temperatures. As a result, the deterioration of crystallinity can be avoided.

Further, when monosilane or disilane is used as a silicon source gas, the upper limit of a film forming temperature is set at 950° C. When dichlorosilane is used as a silicon source gas, the upper limit of a film forming temperature is set at 1100° C. When trichloro silane is used as the silicon source gas, the upper limit of a film forming temperature is set at 1150° C. When silicon tetrachloride is used as a silicon source gas, the upper limit of a film forming temperature is set at 1200° C. It was examined by experiment that when these conditions are satisfied, the epitaxial film can be grown with no crystalline defect.

Figure 9A:
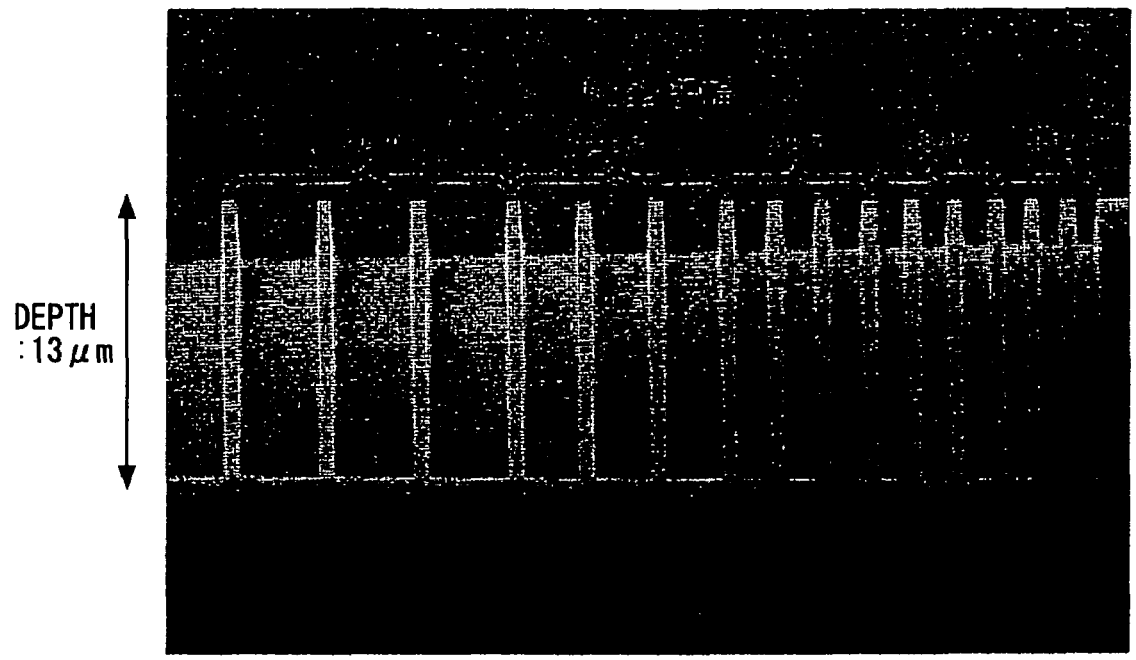
FIG. 9A is a photograph of cross sectional SEM image showing a trench in a silicon substrate as a comparison of the first embodiment.
Figure 9B:
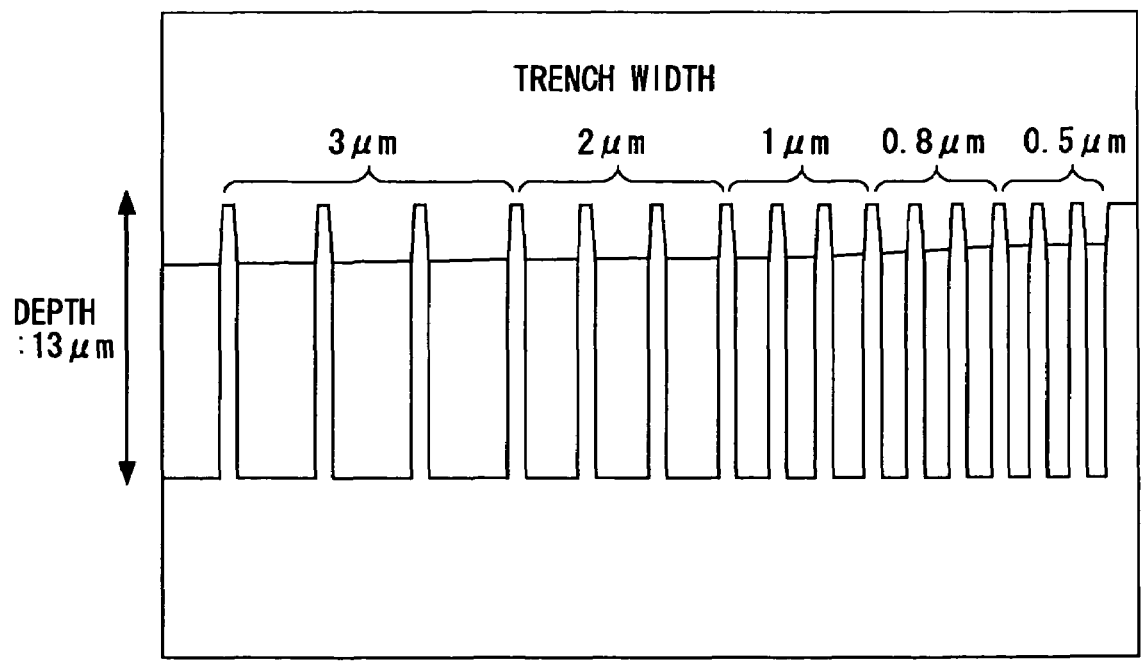
FIG. 9B is an illustrative view of photograph in FIG. 9A.
Figure 10A:
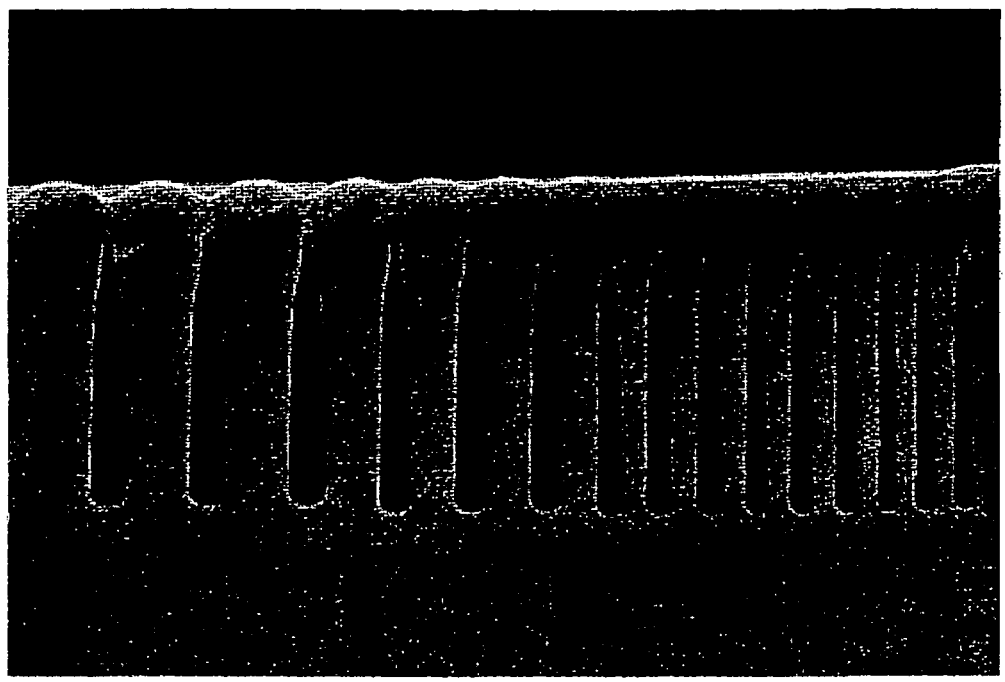
FIG. 10A is a photograph of cross sectional SEM image showing a silicon substrate after a 3 μm-deposition with using a dichlorosilane gas at a temperature higher than 1100° C.
Figure 10B:
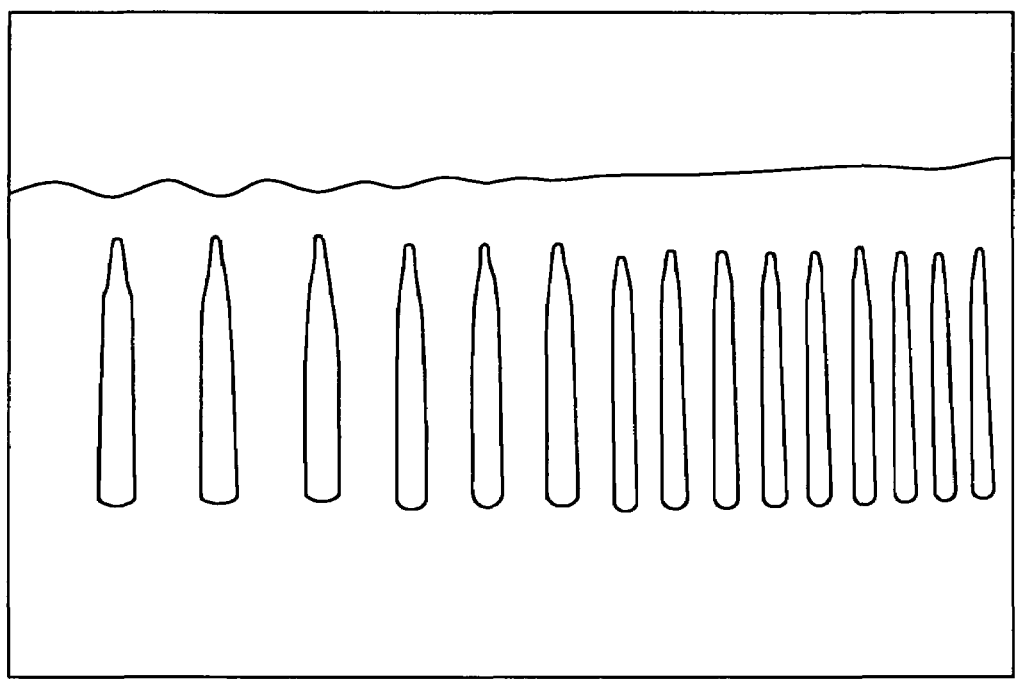
FIG. 10B is an illustrative view of photograph in FIG. 10A.
Figure 11A:
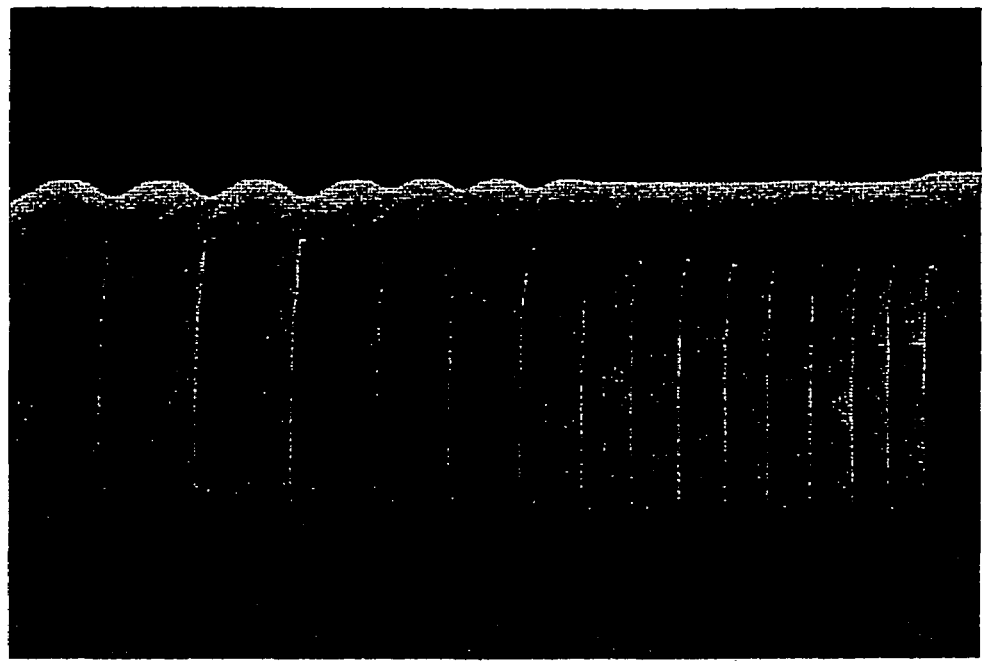
FIG. 11A is a photograph of cross sectional SEM image showing a silicon substrate after a 3 μm-deposition with using a mixed gas at a temperature higher than 1100° C.
Figure 11B:
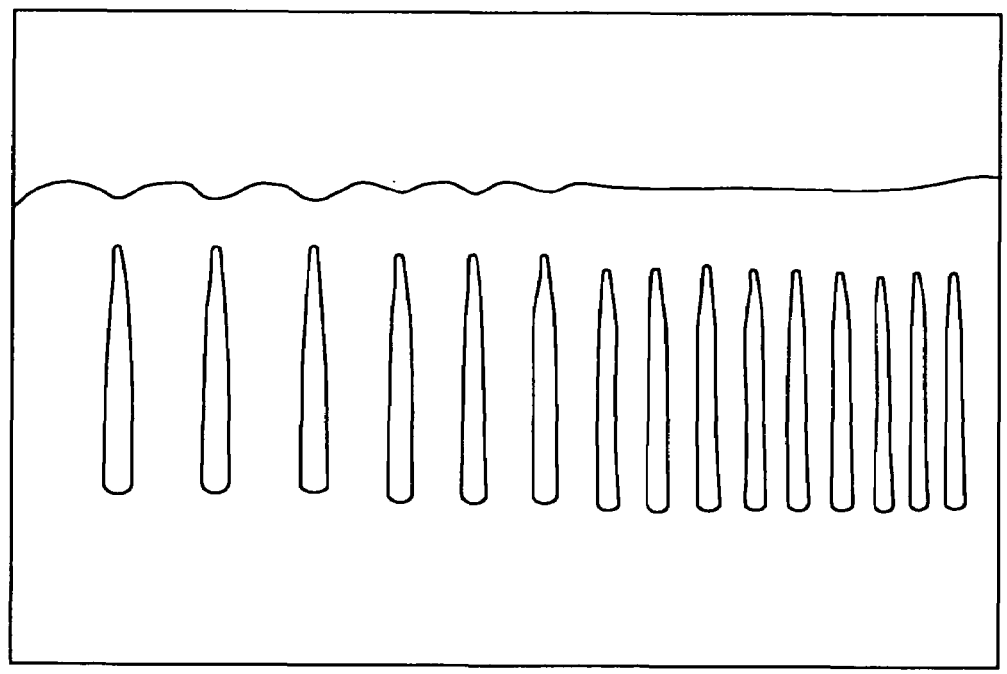
FIG. 11B is an illustrative view of photograph in FIG. 11A.

Specific examples will be described by the use of FIGS. 9A to 14B. FIGS. 9A to 14B show sectional images of a substrate taken by SEM so as to evaluate the epitaxial film filled in the trenches. As shown in FIGS. 9A and 9B, an epitaxial film was grown on a substrate having trenches formed by etching. At this time, the widths of trenches formed in the substrate were 3 μm, 2 μm, 1 μm, 0.8 μm, and 0.5 μm and the depth of the trench was 13 μm for all trenches. Dichlorosilane was supplied to the substrate in the atmosphere of a higher temperature than 1100° C. to form an epitaxial film of 3 μm in thickness and the result shown in FIGS. 10A and 10B was obtained. In FIGS. 10A and 10B, no halogenide gas is used. On the other hand, a mixed gas of dichlorosilne and hydrogen chloride was supplied to the substrate in the atmosphere of the same temperature (atmosphere of a higher temperature than 1100° C.) to form an epitaxial film of 3 μm in thickness and the result shown in FIGS. 11A and 11B was obtained. In FIGS. 11A and 11B, a halogenide gas is used.

Figure 12A:
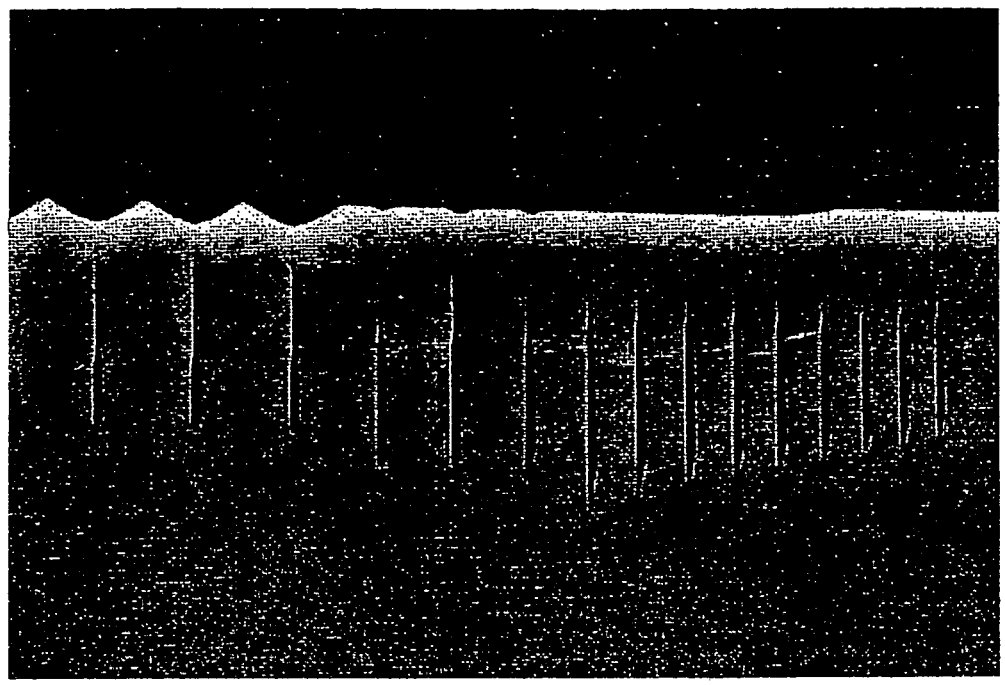
FIG. 12A is a photograph of cross sectional SEM image showing a silicon substrate after a 3 μm-deposition with using a dichlorosilane gas at a temperature equal to or lower than 1100° C.
Figure 12B:
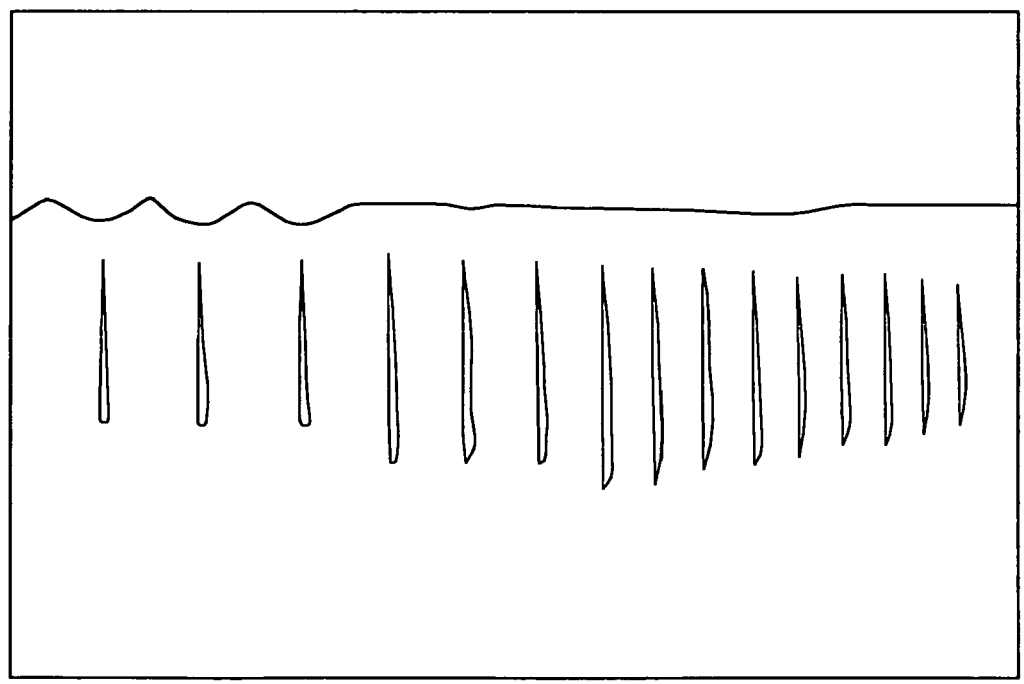
FIG. 12B is an illustrative view of photograph in FIG. 12A.
Figure 13A:
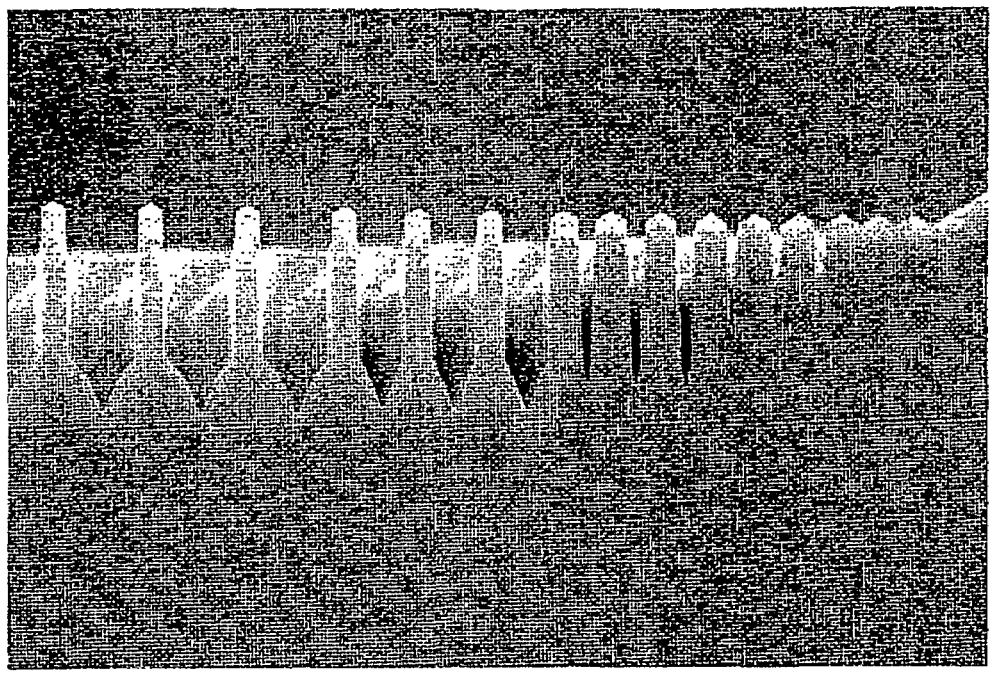
FIG. 13A is a photograph of cross sectional SEM image showing a silicon substrate after a 3 μm-deposition with using a mixed gas at a temperature equal to or lower than 1100° C.
Figure 13B:
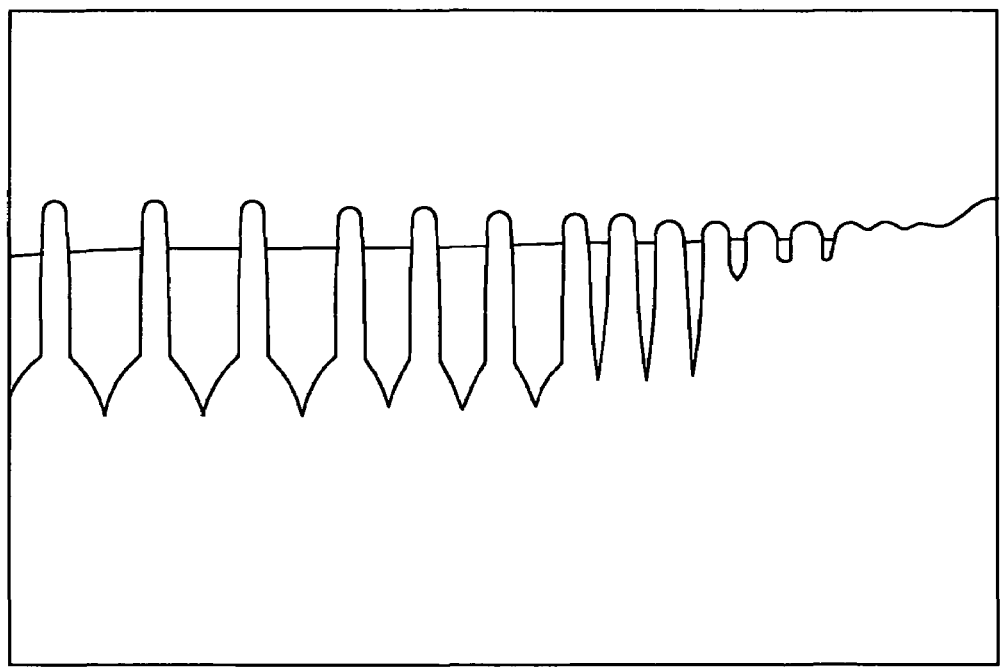
FIG. 13B is an illustrative view of photograph in FIG. 13A.
Figure 14A:
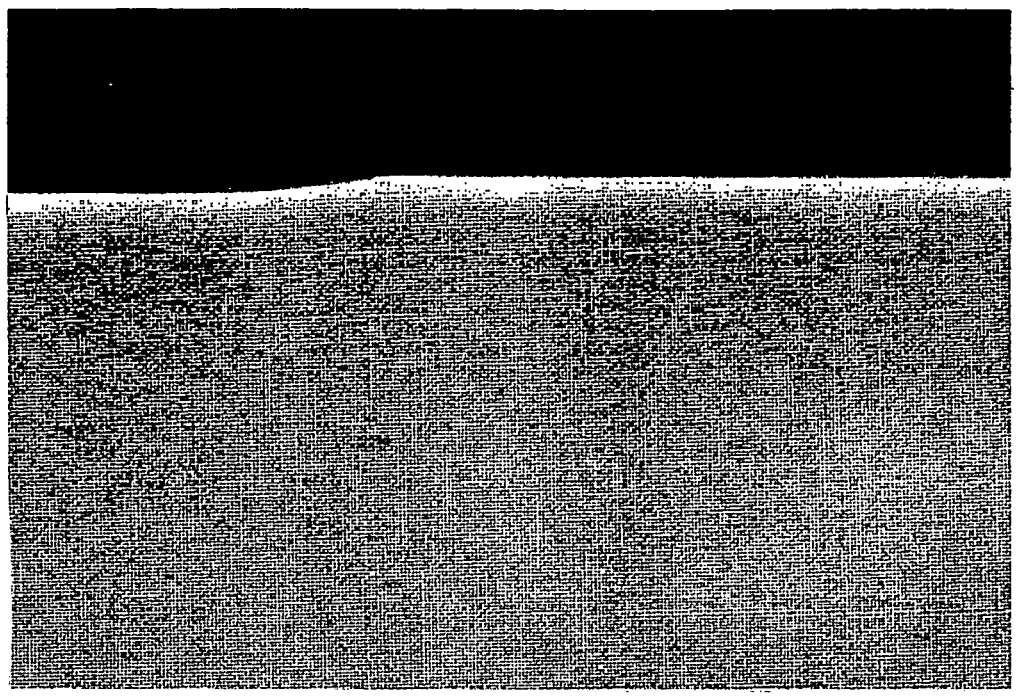
FIG. 14A is a photograph of cross sectional SEM image showing a silicon substrate after a 10 μm-deposition with using a mixed gas at a temperature equal to or lower than 1100° C.
Figure 14B:
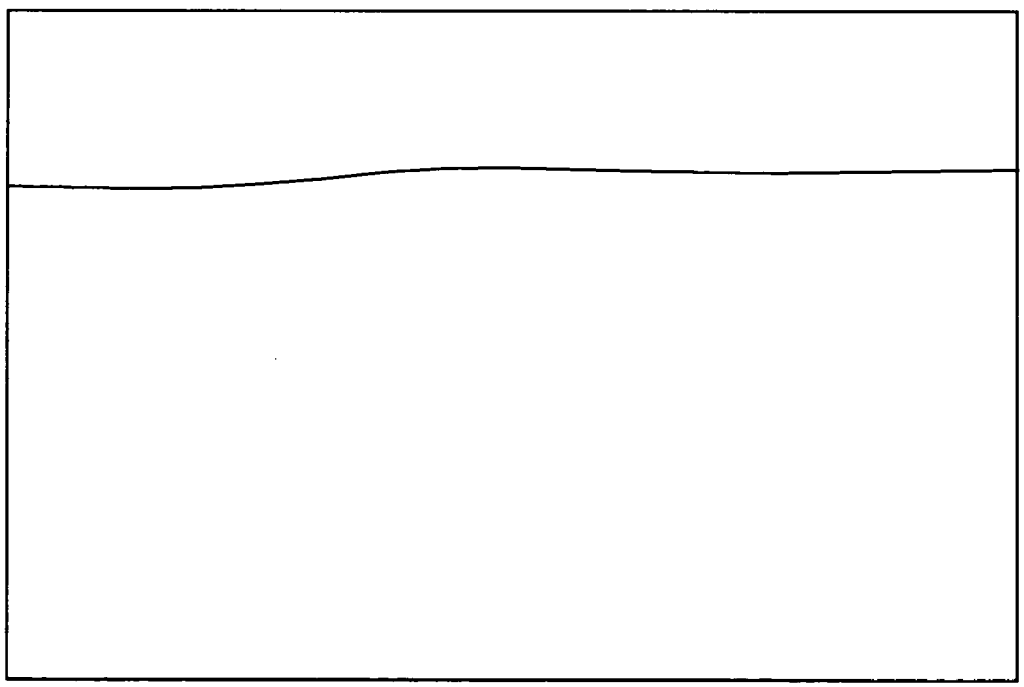
FIG. 14B is an illustrative view of photograph in FIG. 14A.

Dichlorosilane was supplied to the substrate, in which the trenches shown in FIGS. 9A and 9B were formed, in the atmosphere of a lower temperature equal to or lower than 1100° C. to form an epitaxial film of 3 μm in thickness and the result shown in FIGS. 12A and 12B was obtained. In FIGS. 12A and 12B, no halogenide gas is used. On the other hand, a mixed gas of dichlorosilne and hydrogen chloride was supplied to the substrate in the atmosphere of the same temperature (atmosphere of a lower temperature equal to or lower than 1100° C.) to form an epitaxial film of 3 μm in thickness and the result shown in FIGS. 13A and 13B was obtained. In FIGS. 13A and 13B, a halogenide gas is used. Further, an epitaxial film of 10 μm in thickness was formed under the same condition and the result shown in FIGS. 14A and 14B was obtained. In FIGS. 14A and 14B, a halogenide gas is used.

Voids in the trenches are smaller in size in FIGS. 11A and 11B than in FIGS. 10A and 10B. Further, voids exist in the trenches in FIGS. 12A and 12B whereas, as can be seen from FIGS. 13A and 13B, the trench openings are prevented from being closed. These results show the effect produced by the mixing of a halogenide gas and the effect produced by the forming of the epitaxial film at 1100° C. or less by the use of the mixed gas of dichlorosilane and a halogenide gas. As a result, the epitaxial film having no void can be formed as shown in FIGS. 14A and 14B.

Further, the lower limit of the film forming temperature was set at 800° C. within a range of vacuum pressure of forming a film from an atmospheric pressure to 100 Pa. The lower limit of the film forming temperature was set at 600° C. within a range of vacuum pressure of forming a film from 100 Pa to $1 \times 10^{-5}$ Pa. It was examined by experiment that when these conditions were satisfied, the epitaxial film with no void could be grown. The vacuum pressure and the film forming temperature are elements to determine crystallinity. As for the vacuum pressure, oxygen and $H_2O$ remaining in the chamber are reduced in the atmosphere of low vacuum pressure to prevent the oxidization of the surface of silicon, whereby a surface migration phenomenon necessary for securing the crystallinity of the epitaxial film can become resistant to being impaired. On the other hand, low film forming temperature raises apprehension that crystallinity deteriorates. With these results, even when the epitaxial film is formed at low temperatures at the low vacuum pressure, the deterioration of crystallinity can be avoided. As a result, it is possible to realize the epitaxial growth of excellent crystallinity even at low temperatures and hence to form the epitaxial film at lower temperatures under a control of a chemical reaction.

Next, there will be presented a description of the above-described condition [C] that the epitaxial film is filled in the trenches after the oxide film, which is used as a mask when the trenches are formed by etching, is removed.

When the epitaxial film is grown and filled in the trenches in a state where the oxide film used as a mask for etching remains, there is a possibility that crystalline defects might be caused by stress produced by a polycrystalline silicon film growing on the oxide film used as a mask and the epitaxial film growing in the trenches. For this reason, the epitaxial film is formed and filled in the trenches after the oxide film used as a mask is removed. This can prevent the influence of crystalline defects.

Next, the orientation of surface (side and bottom surfaces of trench) of the silicon substrate of the above-described condition [D] will be described.

When the epitaxial film is formed by the use of the mixed gas of a silicon source gas and a halogenide gas, the orientation of the surface of the substrate and the side surface of the trench are determined as follows.

By using a Si (110)-surface orientation substrate, the orientation of the bottom surface of trench is made to have the (110)-surface orientation and the orientation of the side surface of trench is made to have the (111)-surface orientation. Alternatively, by using a Si (100)-surface orientation substrate, the orientation of the bottom surface of trench is made to have the (100)-surface orientation and the orientation of the side surface of trench is made to have the (100)-surface orientation. This can prevent the trench opening from being closed by the grown epitaxial film to make the epitaxial film easily be filled in the trenches.

To be specific, when trenches are arranged on the Si (100)-surface in a manner vertical or parallel to a flat orientation of the (100)-surface orientation, the bottom surface of trench becomes a Si (100)-surface orientation and the side surface of trench becomes a Si (110)-surface orientation. In this case, a film thickness on the side surface of orientation of the (110)-surface increases as the amount of mixed halogenide gas (HCl) increases. For this reason, epitaxial growth advances on the side surface in a state where a film thickness on the bottom surface of orientation of the (100)-surface does not grow sufficiently. This provides a disadvantage in filling the epitaxial film having no void in the trenches.

In contrast to this, when trenches having a Si (111)-surface orientation side surface are formed on a Si (110)-surface orientation substrate, the thickness of the epitaxial film on the bottom surface of the trench increases as compared with that on the side surface as the amount of mixed halogenide gas (HCl) increases. This can make the epitaxial film be easily filled in the trenches. Further, at the time of forming the trenches of this surface orientation, the forming of the trenches by anisotropic wet etching (to be specific, etching by TMAH or KOH) can decrease etching damages and hence can increase throughput in the etching process.

Further, even when the Si (100)-surface orientation substrate is used, if the trenches of Si (100)-surface orientation side surface are formed, a film thickness on the bottom surface is equal to that on the side surface and hence a relative difference in film thickness is not caused by the surface orientation. Hence, in addition to the effect of forming the trench in the tapered shape, which is produced due to the mixed halogenide, the effect of forming the trenches of Si (100)-surface orientation side surfaces can make the epitaxial be easily filled in the trenches as compared with a case of using Si (110)-surface orientation side surface.

Next, the above-described condition [E] that the aspect ratio of the trench is 2 or more will be described.

Super-junction (p/n column) MOS structure can break a trade-off relationship between normalized ON-state resistance, which is a performance indicator of a power device, and a breakdown voltage.

Figure 8:
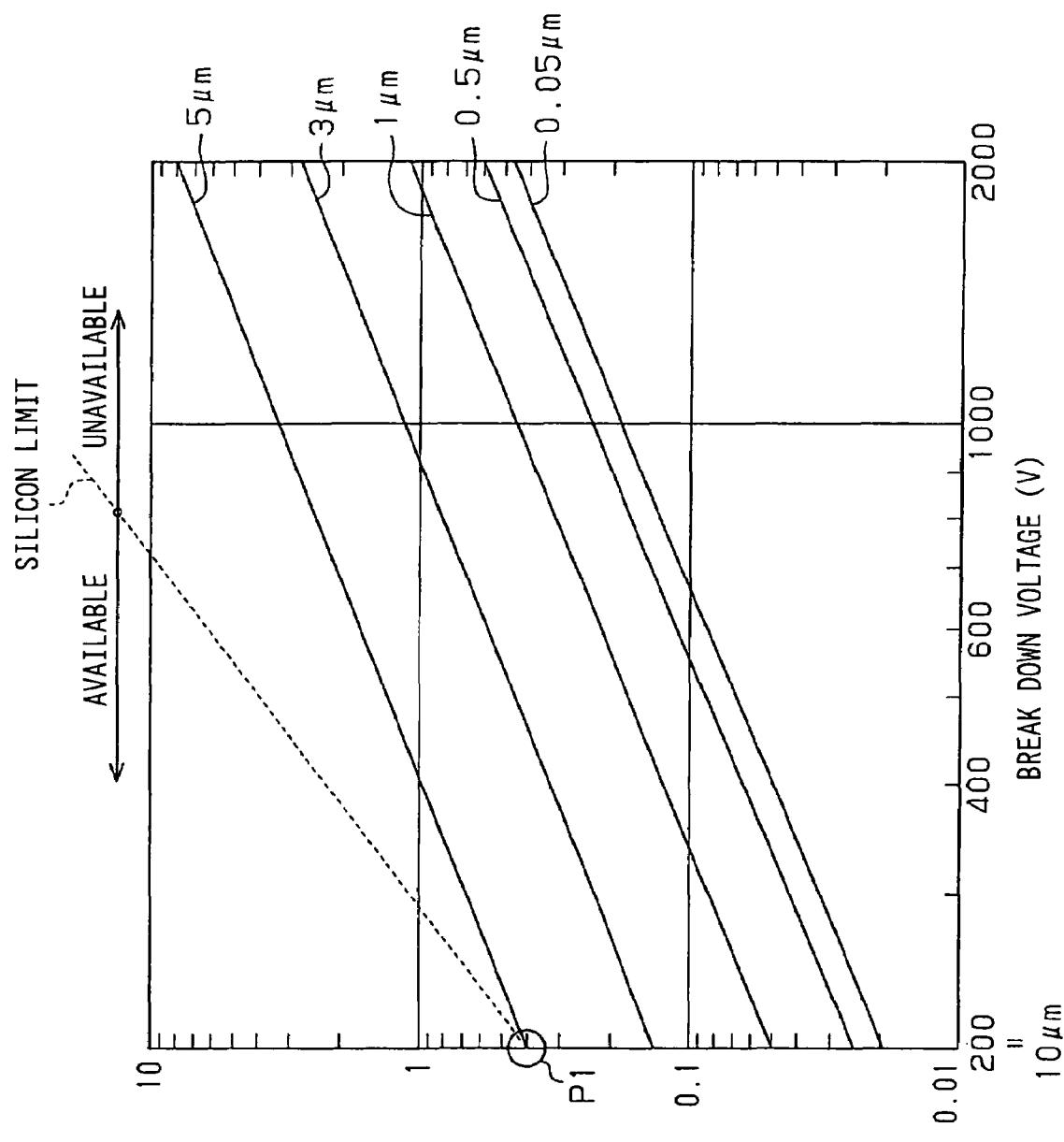
FIG. 8 is a graph explaining a normalized ON-state resistance and a breakdown voltage in different devices, according to the first embodiment.

To be specific, as shown in FIG. 8, the ON-state resistance can be reduced over a limit (silicon limit) in a common DMOS.

However, to reduce ON-state resistance, the aspect ratio of a p/n column structure needs to be increased. As shown in FIG. 8, ON-state resistance is reduced by reducing the width of a column width (width of a trench). Further, as for the depth of a trench, it is known that a breakdown voltage of approximately 10 V per a depth of 2 μm can be obtained. Hence, to realize a high breakdown voltage, the depth of a trench needs to be increased and hence the aspect ratio needs to be further increased. In FIG. 8, a line defined as 5 μm represents the trench having a width of 5 μm so that the aspect ratio of the trench is 10/5=2. A line defined as 3 μm represents the trench having a width of 3 μm so that the aspect ratio of the trench is 10/3. A line defined as 1 μm represents the trench having a width of 1 μm so that the aspect ratio of the trench is 10/1. A line defined as 0.5 μm represents the trench having a width of 0.5 μm so that the aspect ratio of the trench is 10/0.5. A line defined as 0.05 μm represents the trench having a width of 0.05 μm so that the aspect ratio of the trench is 10/0.05. Here, the depth of the trench is 10 μm. A broken line represents a silicon limit, which is a conventional DMOS limit. A left side of the broken line represents a region where the conventional DMOS can operate appropriately. A right side of the broken line represents a region where the conventional DMOS can not operate appropriately.

To be specific, the depth of a trench needs to be approximately 10 μm so as to obtain a breakdown voltage of 200 V and a plot point needs to be on the right side of a plot point P1 in FIG. 8 so as to exceed the silicon limit. Plotting a point on the right side of a plot point P1 means that the width of a column (width of a trench) is made 5 μm or less in FIG. 8, which means that the aspect ratio of a trench is made "2" or more. A high breakdown voltage of 200 V or more requires a higher aspect ratio. Further, since the contribution of a drift resistance becomes smaller in the range of a breakdown voltage of 200 V or less, ON-state resistance can not be reduced only by reducing the drift resist by the super-junction (p/n column) structure. Therefore, a trench needs to be of a structure having an aspect ratio of 2 or more so as to form a super-junction (p/n column)-MOS exceeding the limit of a common DMOS device.

As described above, this embodiment has the following features.

(1) As shown in FIGS. 3C and 3D, the trenches 4 were formed in the silicon substrate (1, 2) formed of the n$^+$ silicon substrate 1 and the epitaxial film 2 and then the epitaxial film 23 was formed on the silicon substrate (1, 2) including the bottom surfaces and side surfaces of the trenches 4, thereby being filled in the trenches 4. Here, at least at the final step of filling of the process of filling the epitaxial film 23 in the trenches 4, as a condition of forming the epitaxial film 23, the growth rate at the trench opening of the epitaxial film 23 growing on the side surface of the trench was made smaller than the growth rate at a portion deeper than the trench opening. Hence, in the epitaxial film 23 growing on the side surface of the trench, the growth rate at the trench opening is made smaller than the growth rate at a portion deeper than the trench opening, which can prevent the trench openings from being closed by the epitaxial film 23 and hence can make the epitaxial film easily be filled in the trenches 4.

(2) The trenches 4 were formed in the silicon substrate (1, 2) formed of the n+ silicon substrate 1 and the epitaxial film 2 and then the epitaxial film 23 was formed on the silicon substrate (1, 2) including the bottom and side surfaces of the trenches 4, thereby being filled in the trenches 4. Here, at least at the final step of filling of the process of filling the epitaxial film 23 in the trenches 4, the mixed gas of a silicon source gas and a halogenide gas was used as gas supplied to the silicon substrate (1, 2). Hence, by using the mixed gas of a silicon source gas and a halogenide gas as gas supplied to the silicon substrate (1, 2) so as to form the epitaxial film 23, the halogenide gas functions an etching gas and the etching rate is determined by supply and hence the etching rate becomes larger at the trench opening than in the trench. Therefore, it is possible to reduce the growth rate at the trench opening of the epitaxial film 23 growing on the side surface of the trench as compared with the growth rate at a portion deeper than the trench opening. This can prevent the trench openings from being closed by the epitaxial film 23 and can make the epitaxial film 23 be easily filled in the trenches 4.

(3) At least at the final step of filling, the mixed gas of a silicon source gas and a halogenide gas was used as gas supplied to the silicon substrate (1, 2) and the epitaxial film 23 was formed under a control of a chemical reaction condition. Therefore, by forming the epitaxial film 23 under a control of a chemical reaction condition, it is possible to further prevent the trench opening from being closed by the epitaxial film 23 and to make the epitaxial film 23 be further easily filled in the trenches 4.

(4) Any one of hydrogen chloride, chlorine, fluorine, chlorine trifluoride, hydrogen fluoride, and hydrogen bromide was used as a halogenide gas. Therefore, by using any one of hydrogen chloride, chlorine, fluorine, chlorine trifluoride, hydrogen fluoride, and hydrogen bromide among gases to be used for a common CVD apparatus, it is possible to produce an effect of producing an etching action at the trench opening and reducing the growth rate.

(5) Any one of monosilane, disilane, dichlorosilne, trichlorosilane, and silicon tetrachloride was used as a silicon source gas. That is, any one of monosilane, disilane, dichlorosilne, trichlorosilane, and silicon tetrachloride can be used among gases used in a common CVD apparatus. In particular, when any one of dichlorosilne, trichlorosilane, and silicon tetrachloride is used as a silicon source gas, it is possible to form the epitaxial film 23 by a control of a chemical reaction under a higher temperature and better crystallinity condition. In other words, it is possible to expand the temperature range in which the epitaxial film is formed by a control of a chemical reaction to a higher temperature range and to prevent the deterioration of crystallinity.

(6) Monosilane or disilane was used as a silicon source gas and the upper limit of a film forming temperature was set at 950° C. Alternatively, dichlorosilane was used as a silicon source gas and the upper limit of a film forming temperature was set at 1100° C. Alternatively, trichlorosilane was used as a silicon source gas and the upper limit of a film forming temperature was set at 1150° C. Alternatively, silicon tetrachloride was used as a silicon source gas and the upper limit of a film forming temperature was set at 1200° C. In this manner, the upper limit of the film forming temperature was set at a temperature at which the epitaxial film could be formed under a control of a chemical reaction condition. Further, when the vacuum pressure for forming a film was within a range from an atmospheric pressure to 100 Pa and the lower limit of a film forming temperature was set at 800° C. Alternatively, the vacuum pressure of forming a film was within a range from 100 Pa to $1 \times 10^{-5}$ Pa and the lower limit of a film forming temperature was set at 600° C. In this manner, the lower limit of temperature needs to be set so as to prevent the influence of crystalline defects and the crystalline defects are susceptible to the effect of the vacuum pressure of the atmosphere of a reduced pressure where the epitaxial film is formed. To be specific, in the atmosphere of a low vacuum pressure, oxygen and $H_2O$ remaining in the chamber are reduced to prevent the oxidization of the surface of silicon, whereby a surface migration phenomenon necessary for securing crystallinity of the epitaxial film can be resistant to be impaired. Hence, even when the epitaxial film is formed at low temperatures, the deterioration of crystallinity can be avoided. In consideration of this, it is recommendable to set the lower limit of the film forming temperature in the above-described vacuum pressure.

(7) An oxide film 22 formed over the silicon substrate (1, 2) was used as a mask when the trenches 4 are formed over the silicon substrate (1, 2). Then, the oxide film 22 used as the mask was removed before the epitaxial film 23 was formed after the formation of the trenches. When the oxide film 22 used as a mask is not removed before the epitaxial film 23 is formed after the formation of the trenches, there is a possibility that crystalline defects might be caused by stress produced by the polycrystalline silicon layer growing on the oxide film 22 used as a mask and the epitaxial film 23 growing in the trenches 4. However, in this embodiment, this possibility can be avoided.

(8) In the silicon substrate (1, 2), the bottom surface of trench 4 has the (110)-surface orientation and the side surface of trench 4 has the (111)-surface orientation. Alternatively, in the silicon substrate (1, 2), the bottom surface of trench 4 has the (100)-surface orientation and the side surface of trench has the (100)-surface orientation. In this embodiment, it is possible to further prevent the trench opening from being closed when the epitaxial film 23 is formed as compared with a case where, in the silicon substrate, the bottom surface of trench has the (100)-surface orientation and where the side surface of trench has the (100)-surface orientation.

(9) The aspect ratio of the trench 4 is 2 or more. Hence, when the aspect ratio of the trench is 2 or more, the effects described in (1) to (9) can be further produced.

In this regard, when the epitaxial film is filled in the trenches after the trenches are formed, in the case where only a silicon source gas is used until a midpoint as the gas supplied to the silicon substrate so as to form the epitaxial film and where a mixed gas of a silicon source gas and a halogenide gas is used from the midpoint (at least at the final step of filling), it is recommended that the amount of supply of halogenide gas be increased with time (the amount of supply of silicon source gas is kept constant). Further, in this case, the amount of supply of halogenide gas may be increased linearly or exponentially.

Second Embodiment

Next, the second embodiment will be described with a particular emphasis on the difference between the second embodiment and the first embodiment.

Figure 15A:
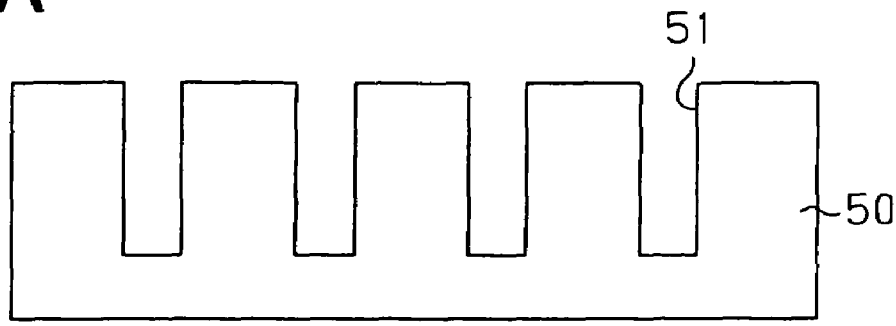
FIGS. 15A to 15D are cross sectional views explaining a method for manufacturing a semiconductor substrate according to a second embodiment of the present invention.
Figure 15B:
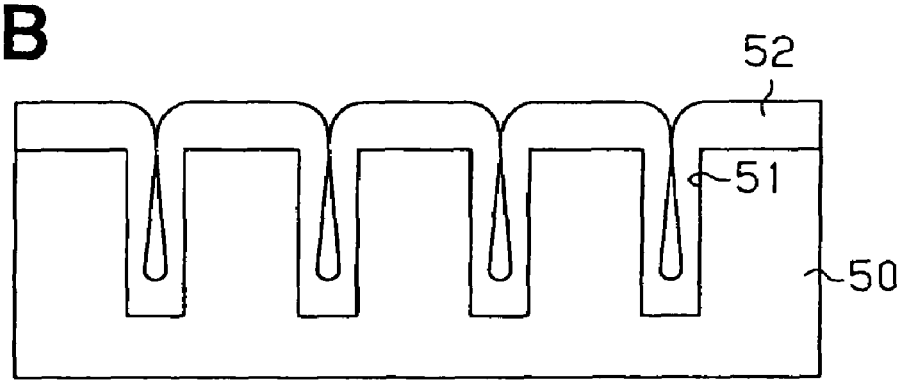
Figure 15C:
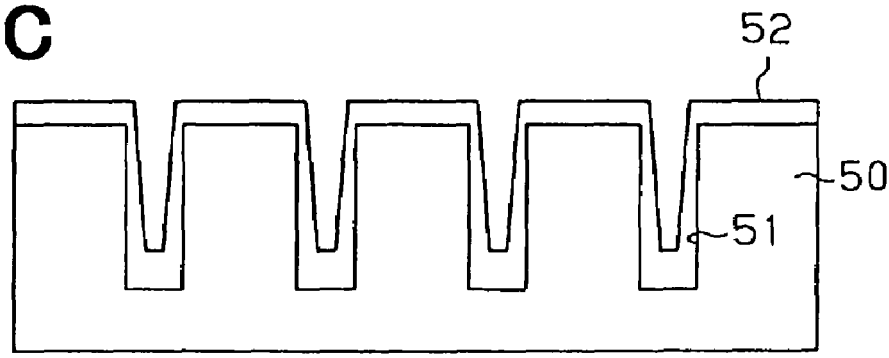

As shown in FIG. 15A, trenches 51 are formed in the silicon substrate 50. Then, as shown in FIG. 15B, an epitaxial film 52 is formed. Further, as shown in FIG. 15C, the epitaxial film 52 is etched by a halogenide gas, whereby the epitaxial film 52 closing the trench openings is removed. Hydrogen chloride (HCl) is used as the halogenide gas.

Figure 15D:
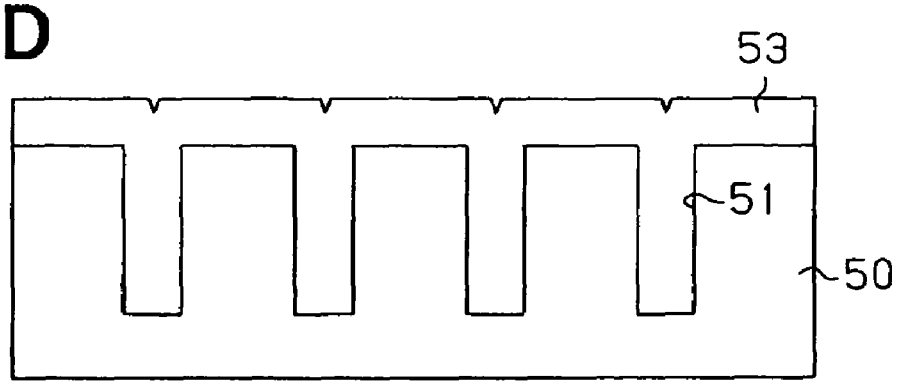

Thereafter, as shown in FIG. 15D, an epitaxial film 53 is again formed, thereby being filled in the trenches 51. At this time, the epitaxial film 53 is formed by epitaxial growth using a mixed gas of a silicon source gas and a halogenide gas (the condition [A] in the first embodiment). Further, the epitaxial film 53 may be grown under additional conditions [B] to [E] in the first embodiment.

The additional etching of the epitaxial film 52 by hydrogen chloride (HCl) can taper the epitaxial film formed in the trenches to provide an advantage of facilitating the filling of the epitaxial film 53 in the trenches. As a result, as the epitaxial growth condition, it is possible to decrease the amount of halogenide gas to be mixed and to use high temperature condition as compared with the first embodiment. Therefore, it is possible to grow the epitaxial film at a high growth rate.

As described above, the trenches 51 are formed in the silicon substrate 50 and then the epitaxial film 52 is formed on the silicon substrate 50 including the bottom and side surfaces of the trenches 51. Then, the epitaxial film 52 is etched by a halogenide gas to expand the openings of the trenches 51, on which the epitaxial film 52 is formed. Then, at least at the final step of filling, a mixed gas of a silicon source gas and a halogenide gas is used as the gas supplied to the silicon substrate 50 so as to form the epitaxial film 53. Hence, after the trenches 51 are formed in the silicon substrate 50, the epitaxial film 53 is formed over the silicon substrate 50 including the bottom and side surfaces of the trenches 51 and then is etched by a halogenide gas, whereby the openings of the trenches 51, on which the epitaxial film 52 is formed, can be expanded. With this, it is possible to prevent the trench openings from being closed by the epitaxial film 53 and hence to facilitate the filling of the epitaxial film 53 in the trenches 51.

Third Embodiment

Next, the third embodiment will be described with a particular emphasis on the difference between the third embodiment and the first and second embodiments.

FIGS. 16A to 16D show a process of manufacturing a semiconductor device with a semiconductor substrate of this embodiment. FIGS. 17A to 17D show the relationship between parameters (processing temperature, the amount of flow of a silicon source gas, the amount of flow a halogenide gas, the amount of flow of a dopant gas) when a process of manufacturing (processing) a semiconductor substrate of this embodiment is continuously performed in an epitaxial film forming apparatus. Here, XVIB in FIGS. 17A to 17D represents a process as a doping epitaxial process without halogenide gas shown in FIG. 16B, XVIC in FIGS. 17A to 17D represents a process as a low concentration epitaxial process with the halogenide gas shown in FIG. 16C, and XVID in FIGS. 17A to 17D represents a process as a thermal diffusion process shown in FIG. 16D.

In this embodiment, the following are taken into consideration.

In the related art, to form a super-junction structure, the respective p/n columns need to have the same amount of charge. Practically, the amount of charge needs to be controlled within a range of approximately 10% or less with respect to target concentrations of the respective p and n columns. Further, it is also absolutely necessary to improve the throughput of a process of filling the epitaxial film in the trenches. Also to prevent defective filling of the epitaxial film in the trenches, it is indispensable to improve the controllability of concentration and to improve the throughput of a process of filling the epitaxial film in the trenches.

In particular, as described in the first embodiment, when the mixed of a silicon source gas and a halogenide gas is used as the gas supplied to the silicon substrate so as to form the epitaxial film, the addition of the halogenide is apt to impair the uniformity of impurity concentration in a wafer surface when impurities are added at the time of epitaxial growth to dope the epitaxial film with impurities. Further, there is apprehension that the addition of halogenide also reduces a growth rate.

Hereafter, a process of manufacturing a semiconductor substrate of this embodiment will be described.

Figure 16A:
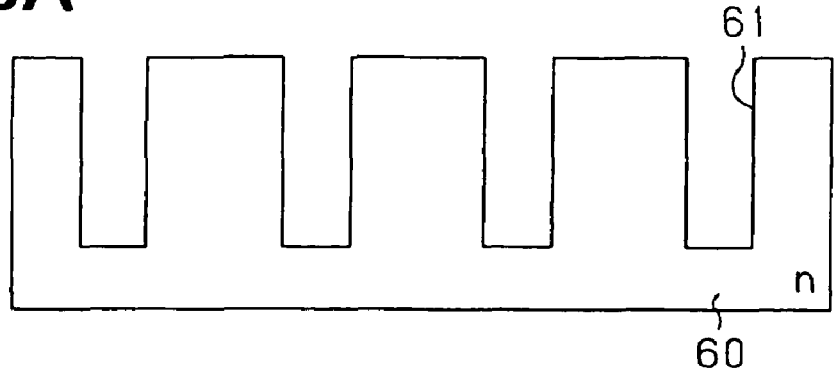
FIGS. 16A to 16D are cross sectional views explaining a method for manufacturing a semiconductor substrate according to a third embodiment of the present invention.
Figure 16B:
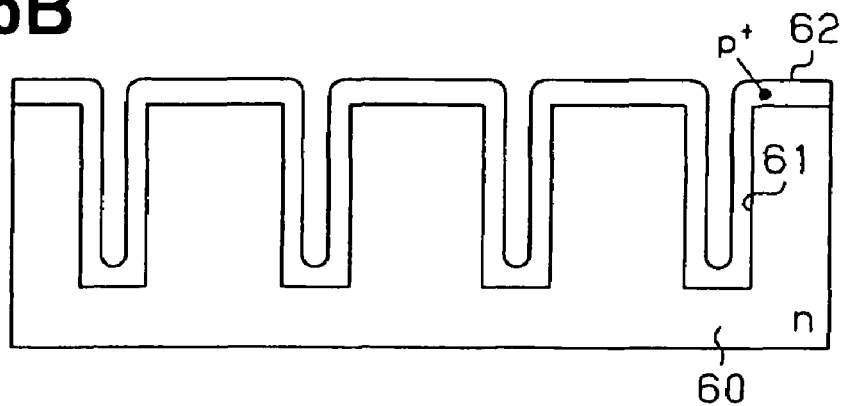

As shown in FIG. 16A, trenches 61 are formed in the top surface of an n type silicon substrate 60 as a semiconductor substrate. Then, as shown in FIG. 16B, an epitaxial film mixed with impurities to be dopants, to be more detailed, a $p^+$ epitaxial film 62 doped with a high concentration of $p^+$ type impurities is formed (grown) over the silicon substrate 60 including the bottom and side surfaces of the trenches 61. When a continuous process shown in FIGS. 17A to 17D is adopted, a processing temperature is increased to a high temperature and a silicon source gas is made to flow at a large amount of flow and a halogenide gas is not made to flow and a dopant gas is made to flow at a large amount of flow (at a high concentration of dopant).

An object of this process (of forming the $p^+$ epitaxial film 62), is to form the $p^+$ epitaxial film 62 over the bottom and side surfaces of the trenches 61 and hence it is not necessary to fill the $p^+$ epitaxial film 62 completely in the trenches 61. For this reason, unlike the epitaxial growth by the mixed gas of a silicon source gas and a halogenide gas as shown in the first embodiment, the epitaxial film is formed only by a silicon source gas. Therefore, in the case of epitaxial growth by the mixed gas in the first embodiment, there is apprehension that a growth rate is reduced by adding a halogenide gas, but since the epitaxial film is formed only by a silicon source gas in this embodiment, the epitaxial film can be formed without the apprehension that throughput is reduced. Further, when it is intended to fill the epitaxial film effectively in the trenches by the mixed gas, the epitaxial film needs to be formed at a low temperature. However, when the $p^+$ epitaxial film 62 is formed in this embodiment, the $p^+$ epitaxial film 62 can be formed at a high temperature at a high growth rate. Further, in the case of mixing a halogenide gas, the distribution of halogenide gas in the wafer surface has a large effect on the amount of mixing of dopant impurities, resulting in impairing the uniformity of concentration distribution in the wafer surface. Still further, epitaxial growth advances at a rate determined by reaction under a lower temperature condition and hence it is not effective to correct the concentration distribution by controlling a gas flow distribution. Therefore, when the halogenide gas is not made to flow and film forming temperature is set at a high temperature, the uniformity of concentration of dopant impurities in the $p^+$ epitaxial film 62 formed in the trenches 61 can be improved.

Here, in this process (of forming the $p^+$ epitaxial film 62), halogenide gas is not made to flow but may be made to flow at an appropriate (small) amount of flow for the purpose of controlling the shapes of the $p^+$ epitaxial films 62 formed in the trenches 61.

Figure 16C:
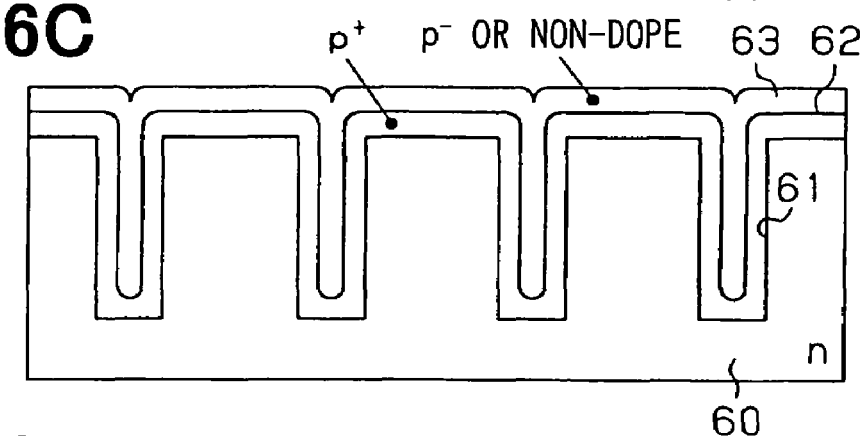

Then, as shown in FIG. 16C, an epitaxial film 63, which is doped with a smaller amount of mixing of dopant than an amount of mixing of dopant in the growth of the p+ epitaxial film 62 or is not doped with dopant, is grown in the p+ epitaxial film (doped epitaxial film) 62 formed in the trenches 61, whereby the trenches 61 are completely filled with the epitaxial film 63. That is, by using a mixed gas of a silicon source gas and a halogenide gas as gas to be supplied to the silicon substrate 60 so as to form the epitaxial film, a p− or non-doped epitaxial film 63 is formed, whereby the trenches 61 are completely filled with the epitaxial film 63. When the continuous process shown in FIGS. 17A to 17D is adopted, a processing temperature is set at a low temperature and a silicon source gas is made to flow at a large amount of flow and a halogenide gas is made to flow at a large amount of flow and a dopant gas is made to flow at a small amount of flow (at a low concentration of dopant) or is not made to flow at all.

In this manner, the epitaxial film 63 is formed by the mixed gas of a silicon source gas and a halogenide gas in a state where the mixed gas is mixed with a low concentration of dopant impurities or is not mixed with dopant gas, whereby the trenches 61 are completely filled with the epitaxial film 63. Since this epitaxial film is doped with a low concentration of impurities or is not doped, the epitaxial film resists the effect that the uniformity of impurity concentration is impaired by the mixing of a halogenide gas. As a result, an epitaxial film having a highly uniform concentration of dopant can be grown in the trenches 61, whereby the trenches 61 are completely filled with the epitaxial film having no void.

Figure 16D:
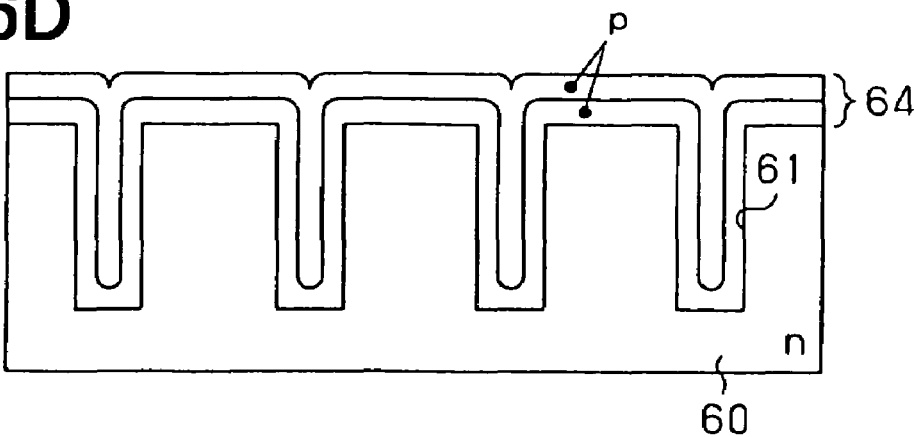
Figure 17A:
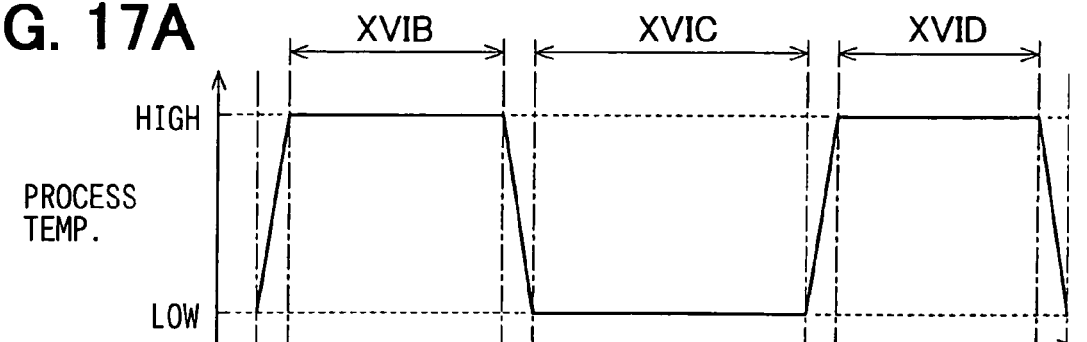
FIGS. 17A to 17D are timing charts showing process conditions of the manufacturing method in each process, according to the third embodiment.
Figure 17B:
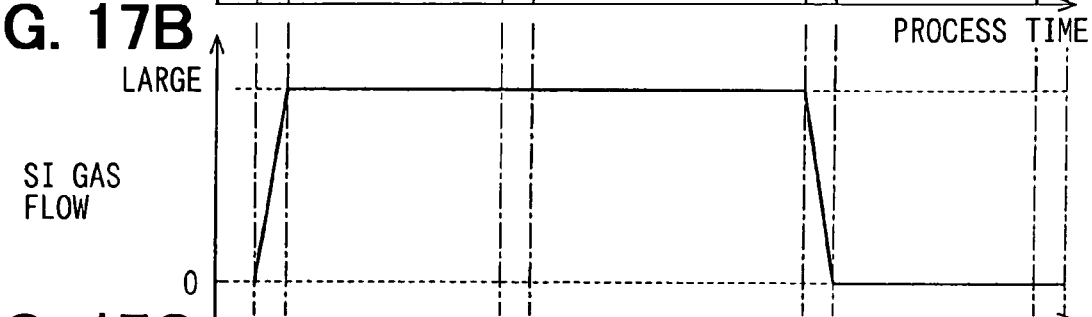
Figure 17C:
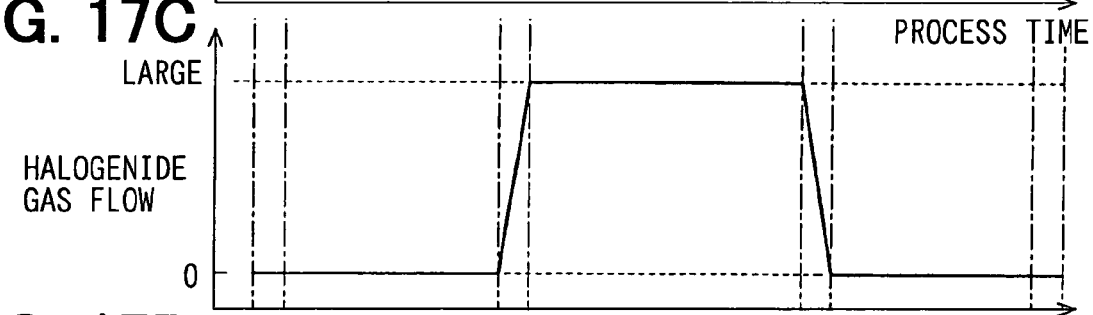
Figure 17D:
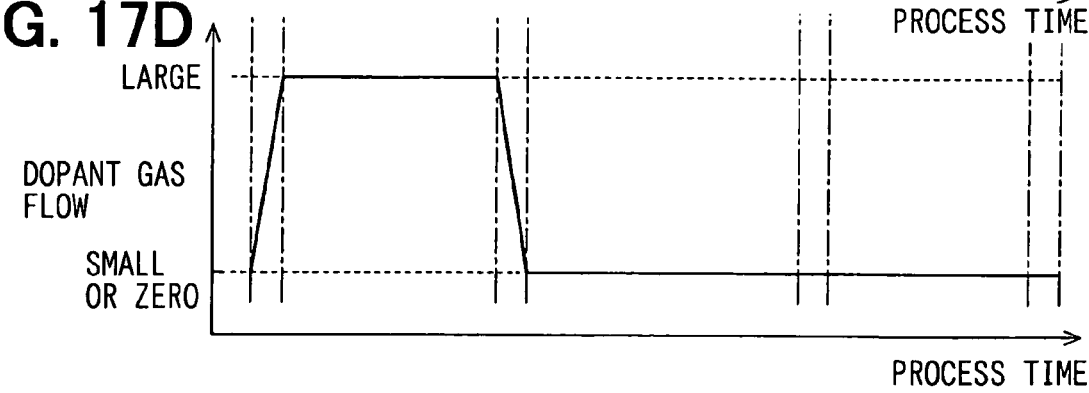

Thereafter, as shown in FIG. 16D, heat treatment is performed following the epitaxial process to diffuse the impurities in the p− or non-doped epitaxial film 63 to make the epitaxial films 62, 63 into a p epitaxial film 64. When the continuous process shown in FIGS. 17A to 17D is adopted, a processing temperature is set at a high temperature and a silicon source gas is not made to flow and a halogenide gas is not made to flow and a dopant gas is not made to flow. With this a p/n column structure having a highly uniform concentration and void-less structure can be formed.

In this regard, the heat treatment can be continuously performed by stopping the film forming gas and the dopant gas and by controlling a processing temperature in an epitaxial film forming apparatus. Alternatively, the impurities can be diffused by a thermal oxidization process or a heat treatment process, which is a downstream process, after the silicon substrate is carried out of the epitaxial film forming apparatus. Further, to form a super-junction device, the respective p/n columns need to have the same amount of charges. As shown in FIG. 16C, even in a state where the p− or non-doped epitaxial film 63 remains, when the amount of charge in the n region of the silicon substrate 60 is equal to the amount of charge in the p+ epitaxial film (filled p epitaxial region) 62, a super-junction operation can be realized. Therefore, even when a p/n column structure is not subjected to a heat treatment, the structure can perform a desired operation.

As described above, in this embodiment, the trenches 61 are formed in the silicon substrate 60 and then the epitaxial film 62 doped with impurities is formed over the silicon substrate 60 including the bottom and side surfaces of the trenches 61. Further, at least at the final step of filling, the epitaxial film 63, which is doped with a lower concentration of impurities than the epitaxial film 62 doped with impurities or is not doped with impurities, is formed by using the mixed gas of a silicon source gas and a halogenide gas as the gas supplied to the silicon substrate 60 so as to form the epitaxial film, whereby the trenches 61 are completely filled.

Hence, when the trenches 61 are completely filled with the epitaxial film 63 formed by using the mixed gas of a silicon source gas and a halogenide gas, the epitaxial film 63 is an epitaxial film doped with a lower concentration of impurities or is not doped with impurities, so that the epitaxial film 63 can resist the effect that the uniformity of impurity concentration is impaired. Further, a reduction in throughput can be prevented by forming the epitaxial film by using only a silicon source gas without using the mixed gas of a silicon source gas and a halogenide gas (in FIGS. 16A to 16D, when the p+ epitaxial film 62 is formed, a halogenide gas is not mixed to improve the uniformity in the impurity concentration and to prevent a reduction in the throughput).

In this manner, it is possible to prevent the trench openings from being closed by the epitaxial film to improve the filling of the trenches by the epitaxial film and further to improve controllability of concentration and throughput.

Further, the epitaxial film 62 doped with impurities is formed over the silicon substrate 60 including the bottom and side surfaces of the trenches 61 and the epitaxial film 63, which is to be completely filled in the trenches 61 and is doped with a low concentration of impurities or is not doped, and then the heat treatment is performed to make the impurity concentration uniform. In particular, when the steps of forming the epitaxial film 62 doped with impurities over the silicon substrate 60 including the bottom and side surfaces of the trenches 61, forming the epitaxial film 63, which is to be completely filled in the trenches 61 and is doped with a low concentration of impurities or is not doped, and the heat treatment are performed in a continuous manner in the same epitaxial film forming apparatus, a continuous process can be realized and hence cost can be reduced.

In this regard, in the steps of forming the film and the heat treatment step, the control of a silicon source gas, a halogenide gas, and a dopant gas has been shown with the drawings, but in addition to these gases, a nonoxidative or non-nitriding gas such as hydrogen or rare gas is introduced as a carrier gas into the apparatus in an atmosphere under a reduced pressure.

Fourth Embodiment

Next, the fourth embodiment will be described with a particular emphasis on the difference between the fourth embodiment and the first and second embodiments.

FIGS. 18A to 18D show a process of manufacturing a semiconductor device with a semiconductor substrate of this embodiment. FIGS. 19A to 19D show the relationship between parameters (processing temperature, the amount of flow of a silicon source gas, the amount of flow a halogenide gas, the amount of flow of a dopant gas) when a process of manufacturing (processing) a semiconductor substrate of this embodiment is continuously performed in an epitaxial film forming apparatus. Here, XVIIIB in FIGS. 19A to 19D represents a process as a low concentration epitaxial process without halogenide gas shown in FIG. 18B, XVIIIC in FIGS. 19A to 19D represents a process as a vapor phase diffusion process without halogenide gas shown in FIG. 18C, XVIIID in FIGS. 19A to 19D represents a process as a low concentration epitaxial process with the halogenide gas shown in FIG. 18D, and XVIIIE in FIGS. 19A to 19D represents a process as a thermal diffusion process shown in FIG. 18E.

Also in this embodiment, as is the case with the third embodiment, it is intended to make the concentration of impurities uniform and to improve throughput.

Figure 18A:
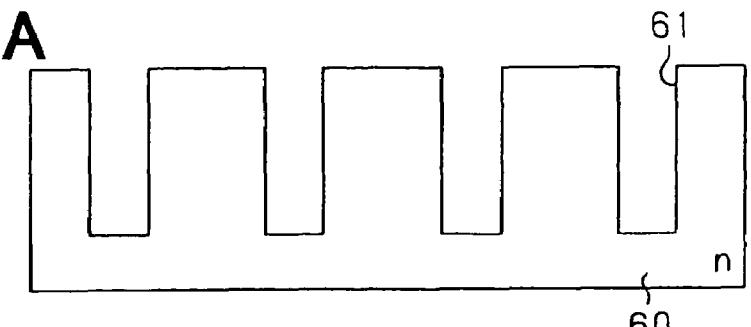
FIGS. 18A to 18E are cross sectional views explaining a method for manufacturing a semiconductor substrate according to a fourth embodiment of the present invention.
Figure 18B:
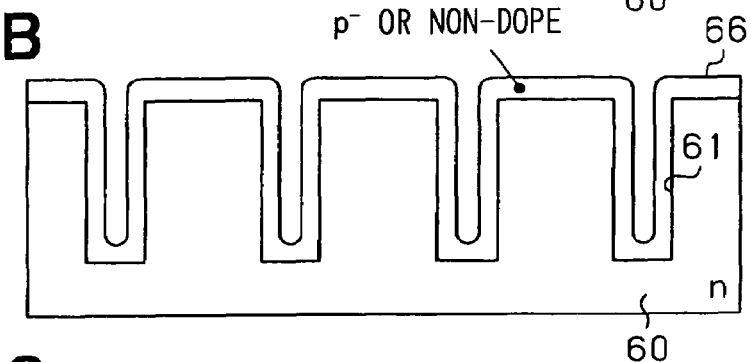

As shown in FIG. 18A, trenches 61 are formed in the top surface of an n type silicon substrate 60 as a semiconductor substrate. Then, as shown in FIG. 18B, an epitaxial film 66, which is doped with a low concentration of p type impurities or is not doped, is formed (grown) over the silicon substrate 60 including the bottom and side surfaces of the trenches 61. When a continuous process shown in FIGS. 19A to 19D is adopted, a processing temperature is increased to a high temperature and a silicon source gas is made to flow at a large amount of flow and a halogenide gas is not made to flow and a dopant gas is made to flow at a small amount of flow (at a low concentration of dopant) or is not made to flow at all.

An object in the forming of the epitaxial film 66 is to form an epitaxial film, which is doped with a low concentration of dopant or is not doped, over the bottom and side surfaces of the trenches 61 and hence it is not necessary to fill the epitaxial film 66 completely in the trenches 61. For this reason, unlike the forming of an epitaxial film by the mixed gas of a silicon source gas and a halogenide gas as shown in the first embodiment, the epitaxial film is formed only by a silicon source gas.

Therefore, as described in the third embodiment, in the case of forming the epitaxial film by the mixed gas, there is apprehension that a growth rate is reduced by adding the halogenide gas, but since the epitaxial film is formed only by the silicon source gas in this embodiment, the epitaxial film can be formed without the apprehension that a growth rate is reduced. Further, when it is intended to fill the epitaxial film effectively in the trenches by the mixed gas, the epitaxial film needs to be formed at a low temperature, but when this epitaxial film 66 is formed, the epitaxial film 66 can be formed at a high temperature at a high growth rate. Further, the using of the epitaxial film 66, which is doped with a low concentration of dopant or is not doped, will eliminate a problem of causing a dopant concentration distribution.

Here, in this process (of forming the epitaxial film 66), the halogenide gas is not made to flow but may be made to flow at an appropriate (small) amount of flow for the purpose of controlling the shapes of the epitaxial films 66 in the trenches 61.

Figure 18C:
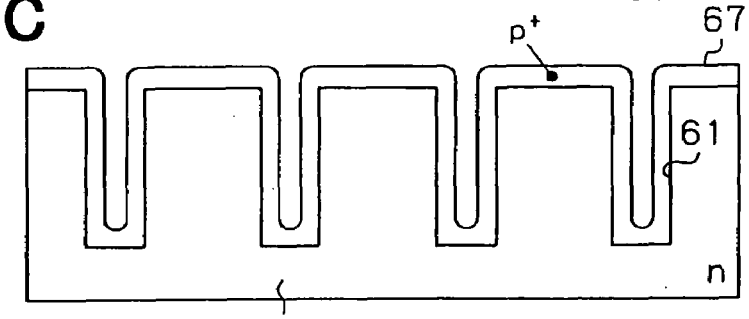

Then, as shown in FIG. 18C, impurities (dopants) are diffused (mixed) from the surface into the p⁻ or non-doped epitaxial film 66 by vapor-phase diffusion to form a diffusion region 67 having a uniform concentration. When a continuous process shown in FIGS. 19A to 19D is adopted, a processing temperature is increased to a high temperature and a silicon source gas is not made to flow and a halogenide gas is not made to flow and a dopant gas is made to flow at a large amount of flow (at a high concentration of dopant). In this manner, in this vapor-phase diffusion, the dopant gas is mixed in a state where the silicon substrate 60 is heated, that is, the dopant gas is introduced into the epitaxial film forming apparatus at a high temperature in a state where the silicon source gas is stopped to diffuse the dopant into the p⁻ or non-doped epitaxial film 66 from the surface thereof. That is, by supplying the dopant gas to the heated silicon substrate 60, the impurities can be introduced into the epitaxial film 66 from the surface thereof.

Figure 18D:
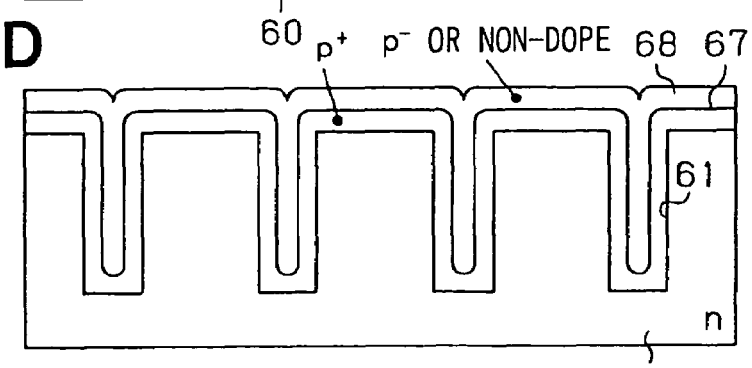

Thereafter, as shown in FIG. 18D, an epitaxial film 68, which is doped with a smaller amount of dopant than the amount of dopant in the growth of the epitaxial film 66 and the vapor phase diffusion or is not doped, is completely filled in the vapor phase diffusion region 67 formed in the trenches 61. That is, the p⁻ or non-doped epitaxial film 68 is formed by using a mixed gas of a silicon source gas and a halogenide gas as gas supplied to the silicon substrate so as to form the epitaxial film, whereby trenches 61 are completely filled with the epitaxial film 68. When the continuous process shown in FIGS. 19A to 19D is adopted, a processing temperature is increased to a high temperature and a silicon source gas is made to flow at a large amount of flow and a halogenide gas is made to flow at a large amount of flow and a dopant gas is made to flow at a small amount of flow (at a low concentration of dopant) or is not made to flow at all.

In this manner, the epitaxial film is formed by the mixed gas of a silicon source gas and a halogenide gas in a state where the mixed gas is mixed with a low concentration of dopant impurities or is not mixed with dopant gas, whereby the trenches 61 are completely filled with the epitaxial film. Since the epitaxial film formed by the mixed gas is doped with a low concentration of dopant or is not doped, the epitaxial film resists the effect that the uniformity of impurity concentration is impaired by the mixing of a halogenide gas. As a result, a diffusion region 67 having a highly uniform concentration of dopant can be grown in the trenches 61, whereby the trenches 61 are completely filled with the epitaxial film having no void.

Figure 18E:
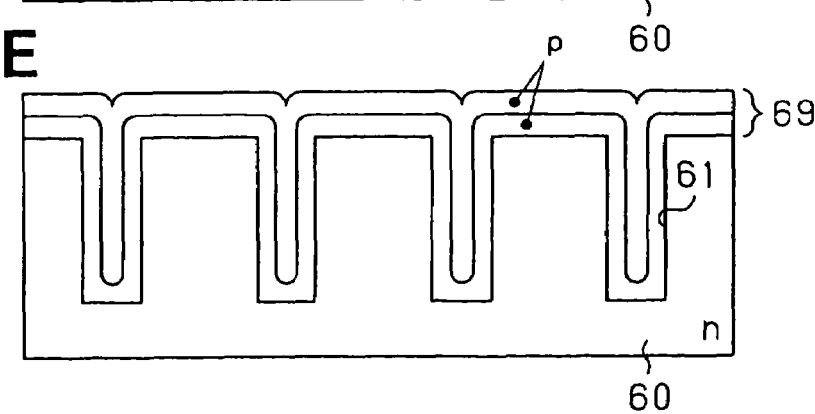

Thereafter, as shown in FIG. 18E, heat treatment is performed following the epitaxial process to diffuse the impurities in the p⁻ or non-doped epitaxial film 68 to make the diffusion region 67 and the epitaxial films 68 into a p epitaxial layer 69. When the continuous process shown in FIGS. 19A to 19D is adopted, a processing temperature is set at a high temperature and a silicon source gas is not made to flow and a halogenide gas is not made to flow and a dopant gas is not made to flow. With this a p/n column structure having a highly uniform concentration and void-less structure can be formed.

In this regard, also in this embodiment, the heat treatment can be continuously performed by stopping the film forming gas and the dopant gas and by controlling a processing temperature in the epitaxial film forming apparatus. Alternatively, the impurities can be diffused by a thermal oxidization process or a heat treatment process after the silicon substrate is carried out of the epitaxial film forming apparatus. Further, a super-junction device requires for the p/n column structure to have the same amount of charges. As shown in FIG. 18D, even in a state where the p⁻ or non-doped epitaxial film 68 remains, when the amount of charge in the n region of the silicon substrate 60 is equal to the amount of charge in the p type diffusion region (filled p region) 67, the device can perform a super-junction operation. Therefore, even when the device has a structure not subjected to a heat treatment, the device can perform a desired operation.

As described above, in this embodiment, the trenches 61 are formed in the silicon substrate 60 and then the epitaxial film 66 is formed over the silicon substrate 60 including the bottom and side surfaces of the trenches 61. Further, impurities are introduced into the epitaxial film 66 from the surface thereof by the vapor phase diffusion to form the region 67 doped with the impurities. Further, at least at the final step of filling, the epitaxial film 68, which is doped with a lower concentration of impurities than the region 67 doped with impurities or which is not doped with impurities, is formed by using the mixed gas of a silicon source gas and a halogenide gas as the gas supplied to the silicon substrate 60 so as to form the epitaxial film, whereby the trenches 61 are completely filled with the epitaxial film 68. Hence, it is possible to make an impurity concentration uniform by introducing the impurities by the vapor phase diffusion. Further, when the trenches 61 are completely filled with the epitaxial film 68 by using the mixed gas of a silicon source gas and a halogenide gas, the epitaxial film 68 is doped with a low concentration of impurities or is not doped with the impurities and hence can resist the effect that the uniformity of impurity concentration is impaired. Further, a reduction in throughput can be prevented by forming the epitaxial film only by the silicon source gas without using the mixed gas of a silicon source gas and a halogenide gas (in FIGS. 18A to 18E, when the epitaxial film 66 is formed, a halogenide gas is not mixed, which can prevent a reduction in throughput).

Further, in the vapor-phase diffusion, impurities are introduced into the epitaxial film 66 from the surface thereof by supplying a dopant gas to the heated silicon substrate 60. Hence, the vapor-phase diffusion can be appropriately performed by this technique (for example, impurities are diffused from the surface of the non-doped epitaxial film).

Still further, the impurity concentration can be made uniform by forming the epitaxial film 66 over the silicon substrate 60 including the bottom and side surfaces of the trenches 61, by the vapor-phase diffusion, by forming the epitaxial film 68, which is to be completely filled in the trenches 61 and is doped with a low concentration of dopant or is not doped, and then by performing the heat treatment. In particular, forming the epitaxial film 66 over the silicon substrate 60 including the bottom and side surfaces of the trenches 61, the vapor-phase diffusion, forming the epitaxial film 68, which is to be completely filled in the trenches 61 and is doped with a low concentration of impurities or is not doped, and then the heat treatment are performed in a continuous manner in the same epitaxial film forming apparatus. By adopting a continuous process in this manner, cost can be cut down.

In this regard, in the steps of forming a film, the vapor-phase diffusion, and the heat treatment, the control of a silicon source gas, a halogenide gas, and a dopant gas has been shown with the drawings, but in addition to these gases, a nonoxidative or non-nitriding gas such as hydrogen or rare gas is introduced as a carrier gas into the apparatus in the atmosphere of a reduced pressure.

Fifth Embodiment

Next, the fifth embodiment will be described with a particular emphasis on the difference between the fifth embodiment and the first and second embodiments.

FIGS. 20A to 20D show a process of manufacturing a semiconductor device with a semiconductor substrate of this embodiment. FIGS. 21A to 21D show the relationship between parameters (processing temperature, the amount of flow of a silicon source gas, the amount of flow a halogenide gas, the amount of flow of a dopant gas) when a process of manufacturing (processing) a semiconductor substrate of this embodiment is continuously performed in an epitaxial film forming apparatus. Here, XXB in FIGS. 21A to 21D represents a process as a vapor phase diffusion process without halogenide gas shown in FIG. 20B, XXC in FIGS. 21A to 21D represents a process as a low concentration epitaxial process with the halogenide gas shown in FIG. 20C, and XXD in FIGS. 21A to 21D represents a process as a thermal diffusion process shown in FIG. 20D.

In this embodiment, it is intended to eliminate the impairing of the uniformity of impurity concentration, which has been described in the third embodiment.

Figure 20A:
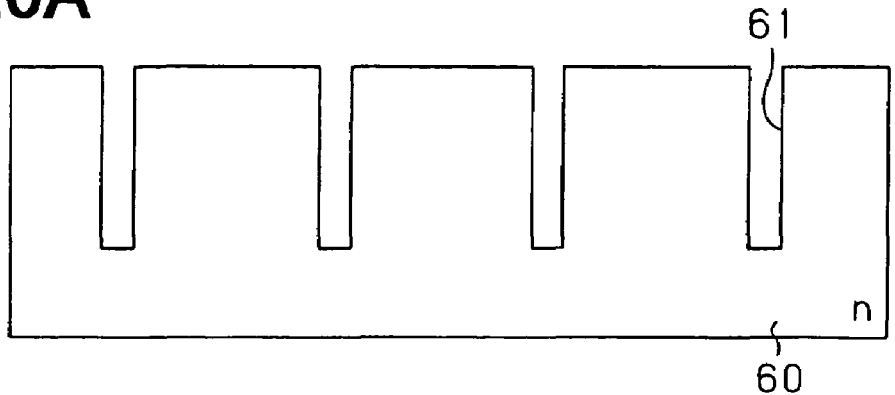
FIGS. 20A to 20D are cross sectional views explaining a method for manufacturing a semiconductor substrate according to a fifth embodiment of the present invention.
Figure 20B:
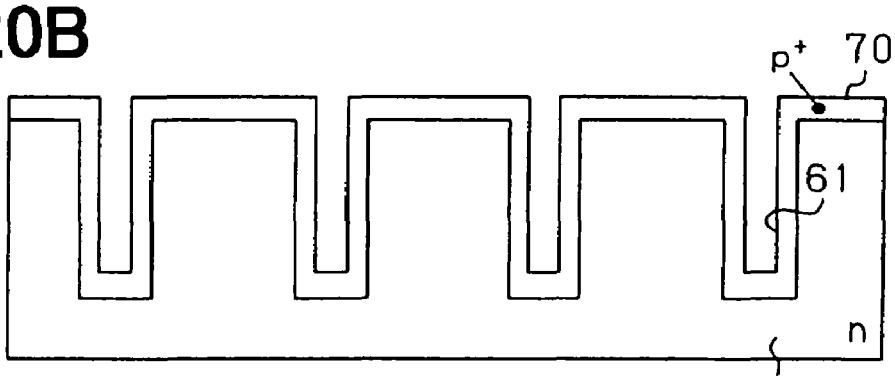

As shown in FIG. 20A, trenches 61 are formed in the top surface of the n type silicon substrate 60 as a semiconductor substrate. Then, as shown in FIG. 20B, impurity dopants are mixed into the inner walls of the trenches 61 (bottom and side surfaces of the trenches 61) to form a doped region 70 of an excellent uniform concentration of dopant by vapor-phase diffusion. When a continuous process shown in FIGS. 21A to 21D is adopted, a processing temperature is increased to a high temperature and a silicon source gas is not made to flow and a halogenide gas is not made to flow and a dopant gas is made to flow at a large amount of flow (at a high concentration of dopant). In this manner, this vapor-phase diffusion is performed by introducing a dopant gas into the apparatus in a state where the silicon substrate 60 is heated, that is, by introducing the dopant gas at a high temperature in a state where a silicon source gas is stopped in the epitaxial film forming apparatus, the dopant can be diffused into the silicon substrate 60 from the surface thereof. That is, by supplying the dopant gas to the heated silicon substrate 60, the dopant can be diffused into the trenches 61 from the bottom and side surfaces thereof.

Figure 20C:
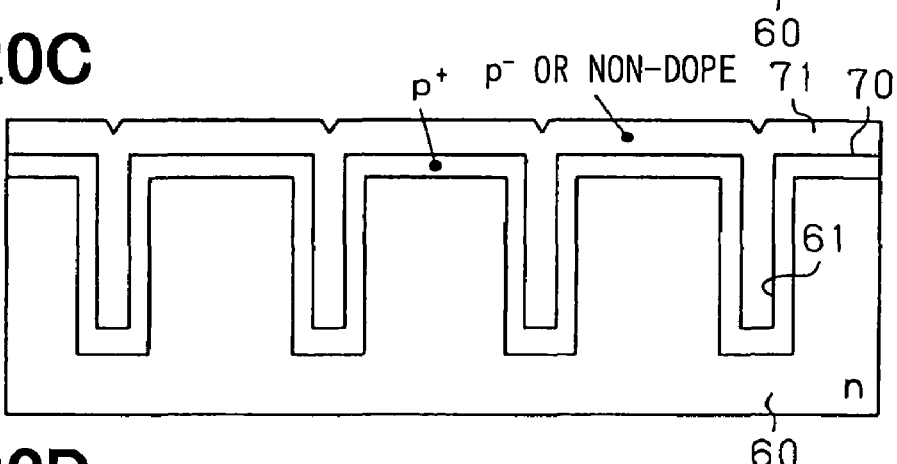

Thereafter, as shown in FIG. 20C, a non-doped or p⁻ epitaxial film 71, which is doped with a smaller amount of dopant than the amount of dopant in a vapor-phase diffusion process, is formed in the trenches 61 (in the vapor-phase doped region 70) by using a mixed gas of a silicon source gas and a halogenide gas as gas supplied to the silicon substrate so as to form an epitaxial film, whereby the trenches 61 are completely filled with the epitaxial film 71. When the continuous process shown in FIGS. 21A to 21D is adopted, a processing temperature is increased to a high temperature and a silicon source gas is made to flow at a large amount of flow and a halogenide gas is made to flow at a large amount of flow and a dopant gas is made to flow at a small amount of flow (at a small concentration of dopant) or is not made to flow at all.

In this manner, the epitaxial film is formed by the mixed gas of a silicon source gas and a halogenide gas as gas supplied to the silicon substrate 60 so as to form an epitaxial film in a state where the mixed gas is mixed with a low concentration of dopant impurities or is not mixed with dopant gas, whereby the trenches are completely filled with the epitaxial film. Since the epitaxial film formed in this manner is doped with a low concentration of dopant or is not doped, the epitaxial film resists the effect that the uniformity of impurity concentration is impaired by the mixing of a halogenide gas. As a result, the doped region 70 having a highly uniform concentration of dopant can be formed in the trenches 61, whereby the trenches 61 are completely filled with the epitaxial film having no void.

Figure 20D:
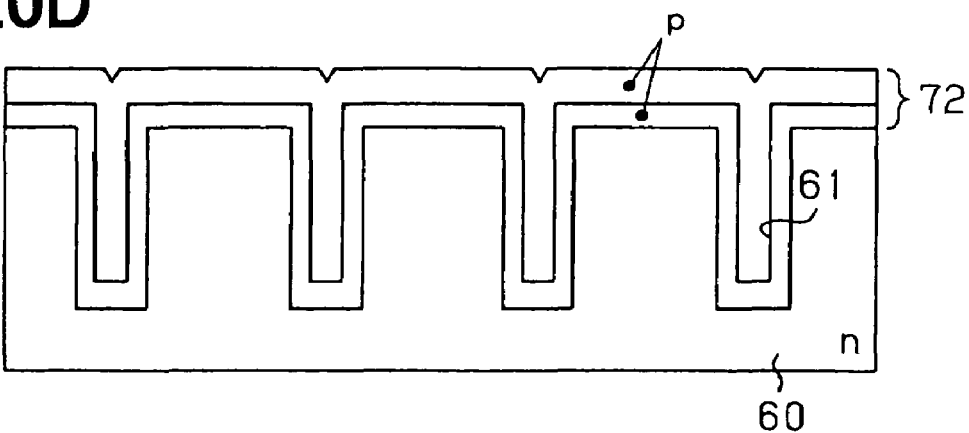
Figure 21A:
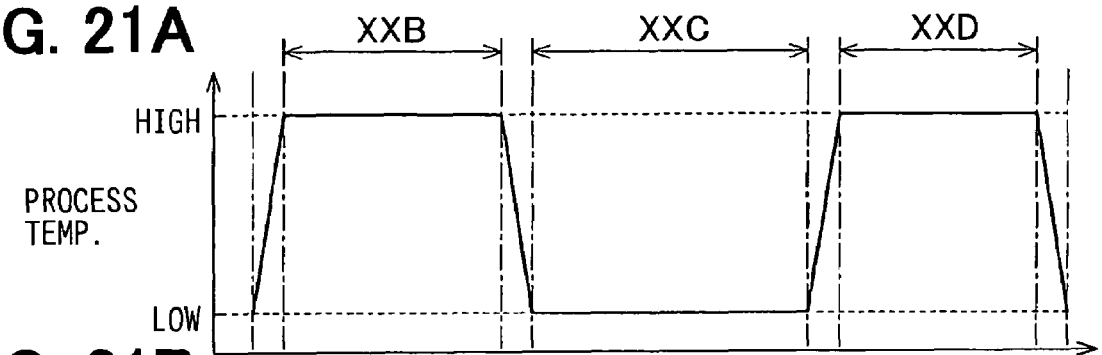
FIGS. 21A to 21D are timing charts showing process conditions of the manufacturing method in each process, according to the fifth embodiment.
Figure 21B:
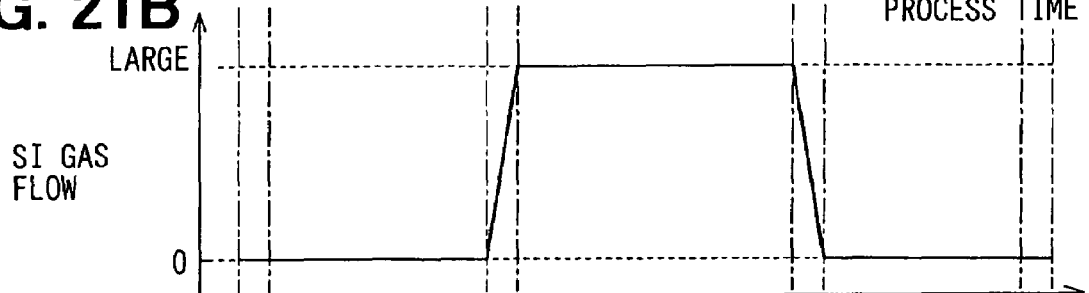
Figure 21C:
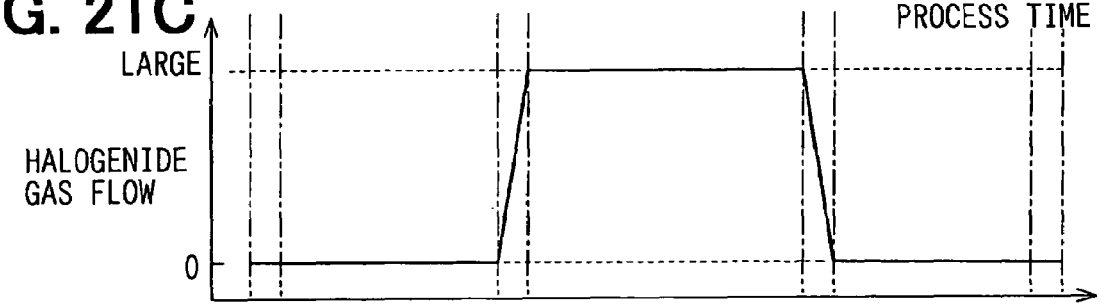
Figure 21D:
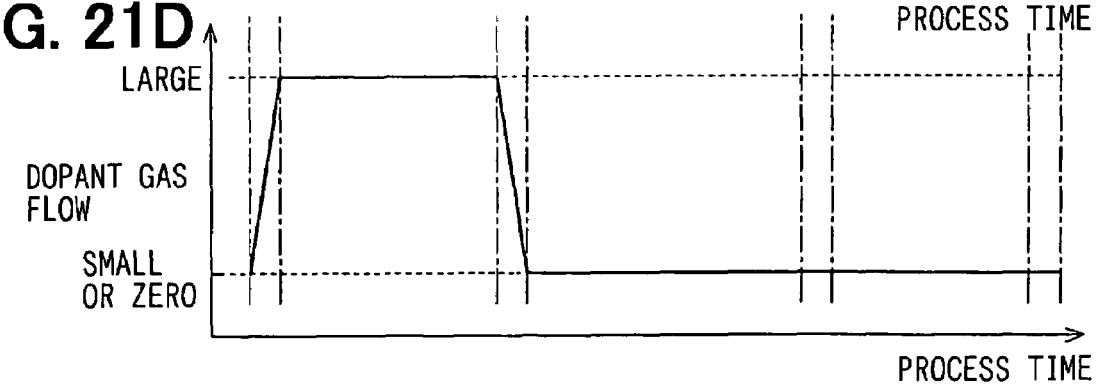

Thereafter, as shown in FIG. 20D, heat treatment is performed following the epitaxial process to diffuse the impurities in the p⁻ or non-doped epitaxial film 71 to make the doped region 70 and the epitaxial film 71 into a p epitaxial layer 72. When the continuous process shown in FIGS. 21A to 21D is adopted, a processing temperature is increased to a high temperature and a silicon source gas does not flow and a halogenide gas does not flow and a dopant gas does not flow. With this a p/n column structure having a highly uniform concentration and void-less structure can be formed.

In this regard, also in this embodiment, the heat treatment can be continuously performed by stopping the film forming gas and the dopant gas and by controlling a processing temperature in the epitaxial film forming apparatus. Alternatively, the impurities can be diffused by a thermal oxidization process or a heat treatment process after the silicon substrate is carried out of the epitaxial film forming apparatus.

Further, a super-junction device requires for the p/n column structure to have the same amount of charges. As shown in FIG. 20C, even in a state where the p⁻ or non-doped epitaxial film 71 remains, when the amount of charge in the n region of the silicon substrate 60 is equal to the amount of charge in the p type doped region (filled p region) 70, the device can perform a super-junction operation. Therefore, even when the device has a structure not subjected to a heat treatment, the device can perform a desired operation.

As described above, in this embodiment, the trenches 61 are formed in the silicon substrate 60 and then impurities are introduced by vapor-phase diffusion from the bottom and side surfaces of the trenches 61 to form the region 70, into which the impurities are introduced, over the bottom and side surfaces of the trenches 61. Further, at least at the final step of filling, the epitaxial film 71, which is doped with a lower concentration of impurities than the region 70 doped with the impurities or which is not doped with the impurities, is formed by using the mixed gas of a silicon source gas and a halogenide gas as the gas supplied to the silicon substrate 60, so as to form the epitaxial film, whereby the trenches 61 are completely filled with the epitaxial film 71. With this, it is possible to make an impurity concentration uniform by introducing the impurities by the vapor-phase diffusion. Further, when the trenches 61 are completely filled with the epitaxial film 71 by using the mixed gas of a silicon source gas and a halogenide gas, the epitaxial film 71 is doped with a low concentration of impurities or is not doped with the impurities and hence can resist the effect that the uniformity of impurity concentration is impaired.

Further, in the vapor-phase diffusion, impurities are introduced into the trenches 61 from the bottom and side surfaces thereof by supplying a dopant gas to the heated silicon substrate 60. Hence, the vapor-phase diffusion can be appropriately performed by this technique.

Still further, the impurity concentration can be made uniform by the vapor-phase diffusion, by forming the epitaxial film 71, which is to be completely filled in the trenches 61 and is doped with a low concentration of dopant or is not doped, and then by performing the heat treatment. In particular, when the vapor-phase diffusion, the formation of the epitaxial film 71, which is to be completely filled in the trenches 61 and is doped with a low concentration of dopant or is not doped, and the heat treatment to the epitaxial film 71 are performed in a continuous manner in the same epitaxial film forming apparatus. By adopting a continuous process in this manner, cost can be cut down.

In this regard, in the steps of forming a film, the vapor-phase diffusion, and the heat treatment, the control of a silicon source gas, a halogenide gas, and a dopant gas has been described with the drawings, but in addition to these gases, a nonoxidative or non-nitriding gas such as hydrogen or rare gas is introduced as a carrier gas into the apparatus in the atmosphere of a reduced pressure.

Sixth Embodiment

Next, the sixth embodiment will be described with a particular emphasis on the difference between the sixth embodiment and the third embodiment.

FIGS. 22A to 22D show a process of manufacturing a semiconductor device with a semiconductor substrate of this embodiment. FIGS. 23A to 23E show the relationship between parameters (the vacuum pressure, processing temperature, the amount of flow of a silicon source gas, the amount of flow a halogenide gas, the amount of flow of a dopant gas) when a process of manufacturing (processing) a semiconductor substrate of this embodiment is continuously performed in an epitaxial film forming apparatus. Here, XXIIB in FIGS. 23A to 23E represents a process as a high vacuum doping epitaxial process without halogenide gas shown in FIG. 22B, XXIIC in FIGS. 23A to 23E represents a process as a low concentration epitaxial process with the halogenide gas shown in FIG. 22C, and XXIID in FIGS. 23A to 23E represents a process as a thermal diffusion process shown in FIG. 22D.

In this embodiment, it is intended to further make the impurity concentration uniform as compared with the third embodiment by controlling the vacuum pressure.

Figure 22A:
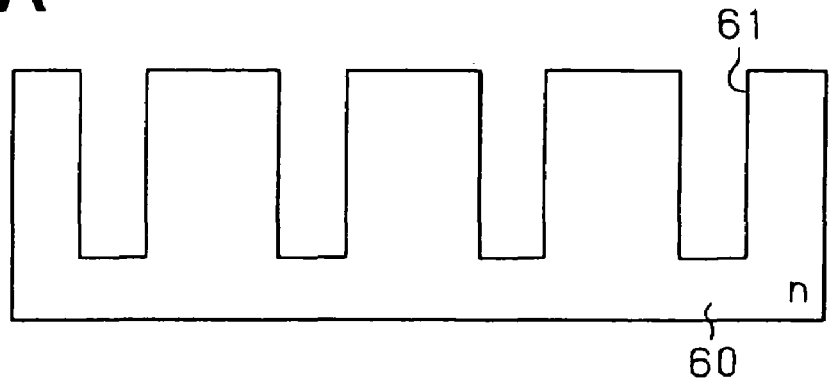
FIGS. 22A to 22D are cross sectional views explaining a method for manufacturing a semiconductor substrate according to a sixth embodiment of the present invention.
Figure 22B:
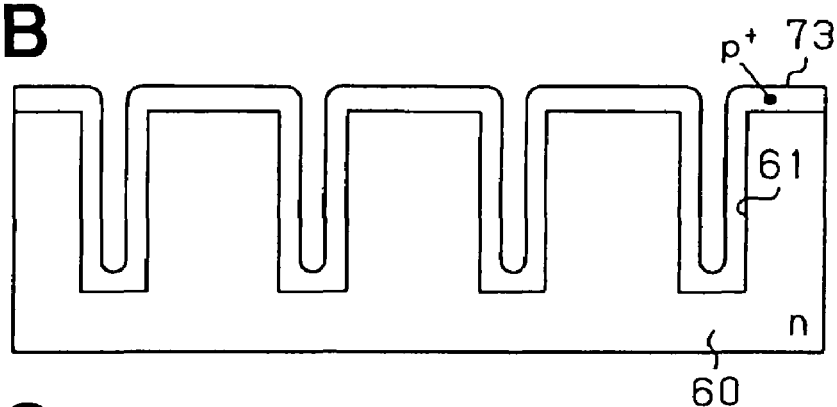

As shown in FIG. 22A, trenches 61 are formed in the top surface of the n type silicon substrate 60 as a semiconductor substrate. Then, as shown in FIG. 22B, a p$^+$ epitaxial film 73 is formed (grown) over the silicon substrate 60 including the bottom and side surfaces of the trenches 61. When the continuous process shown in FIGS. 23A to 23E is adopted, the vacuum pressure is reduced and a processing temperature is set at a high temperature and a silicon source gas is made to flow at a large amount of flow and a halogenide gas is not made to flow and a dopant gas is made to flow at a large amount of flow (at a high concentration of dopant).

In this process (of forming the p$^+$ epitaxial film 73), a doped epitaxial film is grown in the atmosphere of a low vacuum pressure to prevent the effect of a gas flow distribution to form a film in the state of molecular flow, thereby improving the uniformity of dopant concentration.

Figure 24:
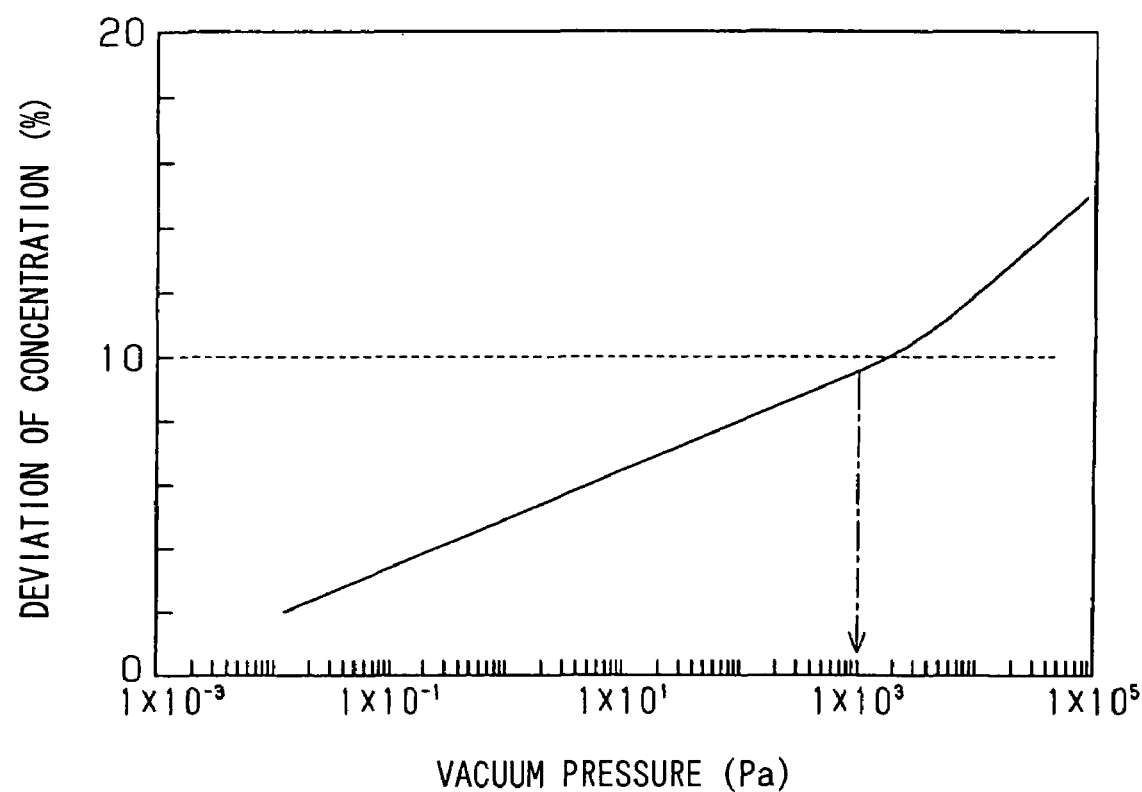
FIG. 24 is a graph showing a relationship between a vacuum pressure and a deviation of impurity concentration in an epitaxial film, according to the sixth embodiment.

In FIG. 24 is shown the range of variation in concentration in the surface of a wafer with respect to the vacuum pressure. In FIG. 24, a vacuum pressure of 1000 Pa or less is required to secure the controllability of concentration within a range of variation of 10% or less in concentration in the surface, which is commonly thought to be necessary for super-junction. Further, considering a reduction of growth rate caused by the reduced vacuum pressure, a range of $1\times10^{-3}$ Pa or more is thought to be appropriate. Hence, the above-described doped epitaxial growth in the atmosphere of a low vacuum pressure is performed within a range from 1000 Pa to $1\times10^{-3}$ Pa.

Figure 22C:
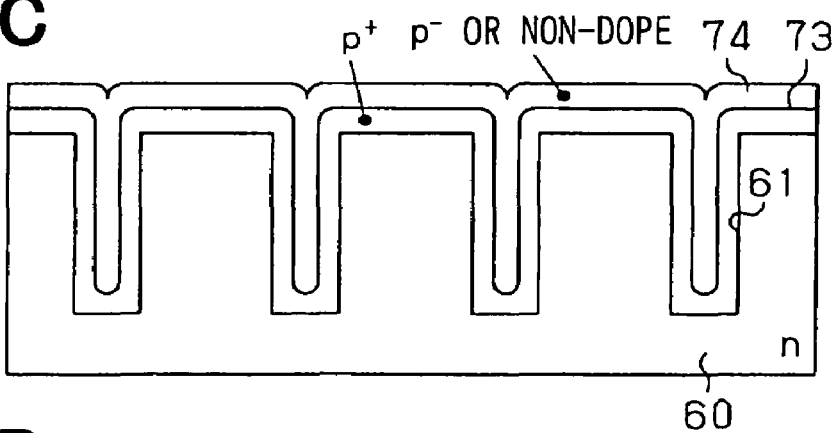

Then, as shown in FIG. 22C, a p$^-$ or non-doped epitaxial film 74 is formed in the p$^+$ epitaxial film (doped epitaxial film) 72 formed in the trenches 61 by using a mixed gas of a silicon source gas and a halogenide gas as gas supplied to the silicon substrate so as to form an epitaxial film at a smaller amount of mixing of dopant than an amount of mixing of dopant in the epitaxial film 73 in the atmosphere of a higher vacuum pressure than in the growth condition of the epitaxial film 73, whereby the trenches 61 are completely filled with the epitaxial film 74. When the continuous process shown in FIGS. 23A to 23E is adopted, the vacuum pressure is increased and a processing temperature is made to a low temperature and a silicon source gas is made to flow at a large amount of flow and a halogenide gas is made to flow at a large amount of flow and a dopant gas is made to flow at a small amount of flow (at a low concentration of dopant) or is not made to flow at all.

In this manner, the epitaxial film is formed by the mixed gas of a silicon source gas and a halogenide gas in a state where the mixed gas is mixed with a low concentration of dopant impurities or is not mixed with dopant gas, whereby the trenches 61 are completely filled with the epitaxial film. As a result, an epitaxial film having a highly uniform concentration of dopant can be grown in the trenches 61, whereby the trenches 61 are completely filled with the epitaxial film having no void.

Figure 22D:
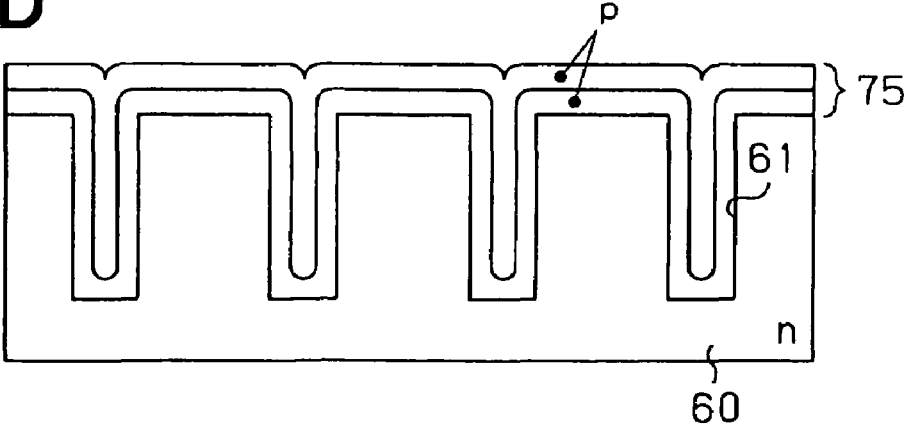

Thereafter, as shown in FIG. 22D, heat treatment is performed following the epitaxial process to diffuse the impurities in the p$^-$ or non-doped epitaxial film 74 to make the epitaxial films 73, 74 into a p epitaxial layer 75. When the continuous process shown in FIGS. 23A to 23E is adopted, a processing temperature is increased to a high temperature in the state where the vacuum pressure is made to high and a silicon source gas is not made to flow and a halogenide gas is not made to flow and a dopant gas is not made to flow. With this a p/n column structure having a highly uniform concentration and void-less structure can be formed.

In this regard, the heat treatment can be continuously performed by stopping the film forming gas and the dopant gas and by controlling a processing temperature in the epitaxial film forming apparatus. Alternatively, the impurities can be diffused by a thermal oxidization process or a heat treatment process, which is a downstream process, after the silicon substrate is carried out of the epitaxial film forming apparatus. Further, a super-junction device requires for the p/n column structure to have the same amount of charges. As shown in FIG. 22C, even in a state where the p⁻ or non-doped epitaxial film 74 remains, when the amount of charge in the n region of the silicon substrate 60 is equal to the amount of charge in the p⁺ epitaxial film (filled p epitaxial region) 73, the device can perform a super-junction operation. Therefore, even when the device has a structure not subjected to a heat treatment, the device can perform a desired operation.

As described above, in this embodiment, in the method for manufacturing a semiconductor substrate in the third embodiment, the vacuum pressure of growth when the epitaxial film 73 doped with impurities is formed over the silicon substrate 60 including the bottom and side surfaces of the trenches 61 is made higher than the vacuum pressure of growth when the epitaxial film 74, which is doped with a lower concentration of impurities or is not doped with impurities, is formed, thereby being completely filled in the trenches 61. Hence, this prevents the effect of a gas flow distribution to form the film in the state of molecular flow, thereby improving the uniformity of impurity concentration.

Further, the vacuum pressure of growth when the epitaxial film 73 doped with impurities is formed over the silicon substrate 60 including the bottom and side surfaces of the trenches 61 ranges from 1000 Pa to $1 \times 10^{-3}$ Pa. Hence, this is preferable from the viewpoint of preventing variations in the impurity concentration and avoiding a growth rate from being reduced by reducing the vacuum pressure.

In this regard, in the film forming step and the heat treatment step, the control of a silicon source gas, a halogenide gas, and a dopant gas has been described with the drawings, but in addition to these gases, a nonoxidative or non-nitriding gas such as hydrogen or rare gas is introduced as a carrier gas into the apparatus in the atmosphere of a reduced pressure. Further, the controlling of the vacuum pressure can be also achieved by changing the amount of flow of carrier gas as appropriate or by controlling the exhaust capacity of an exhaust pump.

Seventh Embodiment

Next, the seventh embodiment will be described with a particular emphasis on the difference between the seventh embodiment and the first and second embodiments.

FIGS. 25A to 25D show a process of manufacturing a semiconductor device with a semiconductor substrate of this embodiment. FIGS. 26A to 26E show the relationship between parameters (vacuum pressure, processing temperature, the amount of flow of a silicon source gas, the amount of flow of a halogenide gas, the amount of flow of a dopant gas) when a process of manufacturing (processing) a semiconductor substrate of this embodiment is continuously performed in an epitaxial film forming apparatus. Here, XXVB in FIGS. 26A to 26E represents a process as a low concentration epitaxial process without halogenide gas shown in FIG. 25B, XXVC in FIGS. 26A to 26E represents a process as a high vacuum doping epitaxial process with the halogenide gas shown in FIG. 25C, and XXVD in FIGS. 26A to 26E represents a process as a thermal diffusion process shown in FIG. 25D.

Also in this embodiment, as is the case with the third embodiment, it is intended to make the concentration of impurities uniform and to improve throughput.

Figure 25A:
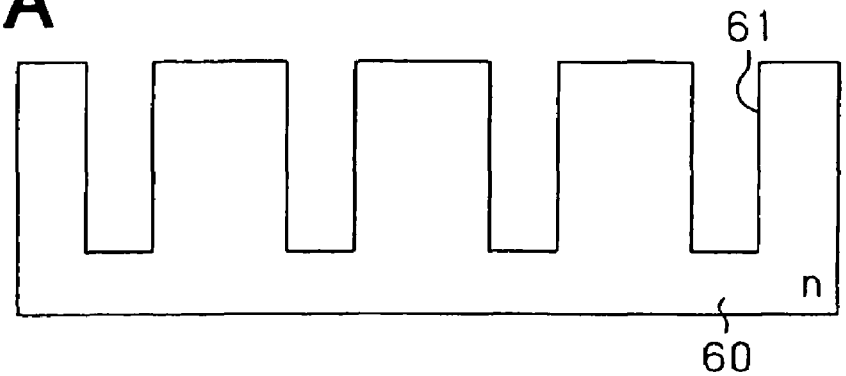
FIGS. 25A to 25D are cross sectional views explaining a method for manufacturing a semiconductor substrate according to a seventh embodiment of the present invention.
Figure 25B:
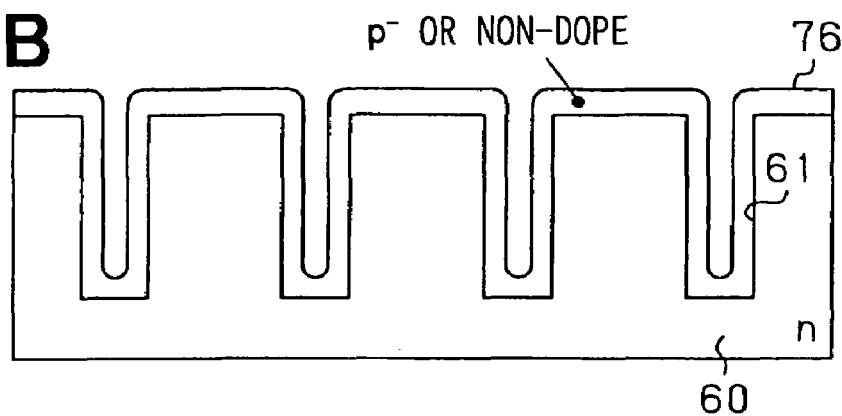

As shown in FIG. 25A, trenches 61 are formed in the top surface of an n type silicon substrate 60 as a semiconductor substrate. Then, as shown in FIG. 25B, an epitaxial film 76, which is doped with a low concentration of impurities or is not doped, is formed (grown) over the silicon substrate 60 including the bottom and side surfaces of the trenches 61. When a continuous process shown in FIGS. 26A to 26E is adopted, the vacuum pressure is highered and a processing temperature is increased to a high temperature and a silicon source gas is made to flow at a large amount of flow and a halogenide gas is not made to flow and a dopant gas is made to flow at a small amount of flow or is not made to flow at all.

In this manner, an object of this process is to form an epitaxial film 76, which is doped with a low concentration of dopant or is not doped, over the bottom and side surfaces of the trenches 61 and hence it is not necessary to fill the epitaxial film 76 completely in the trenches 61. For this reason, unlike the forming of an epitaxial film by the mixed gas of a silicon source gas and a halogenide gas as shown in the first embodiment, the epitaxial film is formed only by a silicon source gas. Therefore, in the case of forming an epitaxial film by the mixed gas, there is apprehension that a growth rate is reduced by adding a halogenide gas, but since the epitaxial film is formed only by the silicon source gas in this embodiment, the epitaxial film can be formed without the apprehension that a growth rate is reduced. Further, when it is intended to fill the epitaxial film more effectively in the trenches by the mixed gas, the epitaxial film needs to be formed at a low temperature, but when this epitaxial film 76 is formed, the epitaxial film 76 can be formed at a high temperature at a high growth rate.

Here, in this process (of forming the epitaxial film 76), the halogenide gas is not made to flow but may be made to flow at an appropriate (small) amount of flow for the purpose of controlling the shape of the epitaxial film 76 in the trenches 61.

Figure 25C:
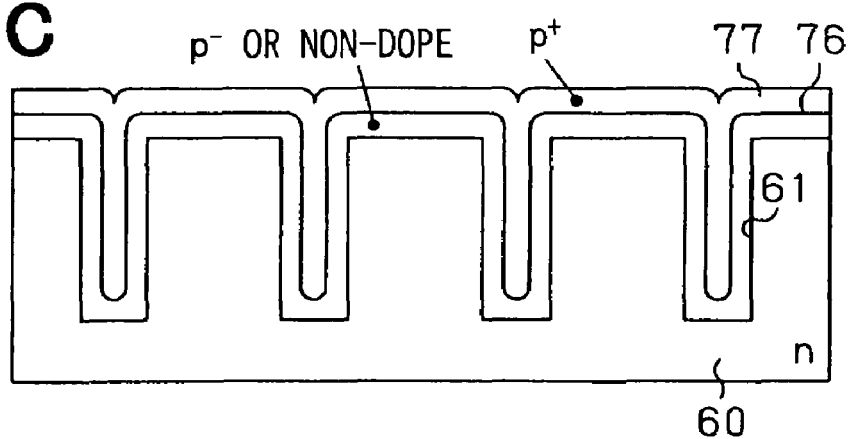

Then, as shown in FIG. 25C, a p⁺ epitaxial film 77 having a larger mount of mixing of dopant than the amount of mixing of dopant in the epitaxial film 76, that is, a p⁺ epitaxial film 77 doped with a high concentration of p type impurities is formed in the p⁻ or non-doped epitaxial film 76 formed in the trenches 61, whereby the trenches 61 are completely filled with the p⁺ epitaxial film 77. At this time, the p⁺ epitaxial film 77 is grown in the atmosphere of a low vacuum pressure by using the mixed gas of a silicon source gas and a halogenide gas as gas supplied to the silicon substrate so as to form the epitaxial film. When a continuous process shown in FIGS. 26A to 26E is adopted, the vacuum pressure is made to a low pressure, a processing temperature is made to a low temperature, a silicon source gas is made to flow at a large amount of flow, a halogenide gas is made to flow at a large amount of flow, and a dopant gas is made to flow at a large amount of flow (at a high concentration of dopant).

In this manner, the doped epitaxial growth is performed by using the mixed gas of a silicon source gas and a halogenide gas in the atmosphere of a low vacuum pressure to form the p⁺ epitaxial film 77. Performing the doped epitaxial growth in the atmosphere of a low vacuum pressure prevents the effect of a gas flow distribution to form the epitaxial film in the molecular flow, which result in improving the uniformity of dopant concentration.

As described by the use of FIG. 24, epitaxial growth in the atmosphere of a low vacuum pressure is performed within a pressure range from 1000 Pa to $1 \times 10^{-3}$ Pa. As a result, a diffusion region having a highly uniform concentration of dopant can be grown in the trenches 61, whereby the trenches 61 are completely filled with the epitaxial film having no void.

Figure 25D:
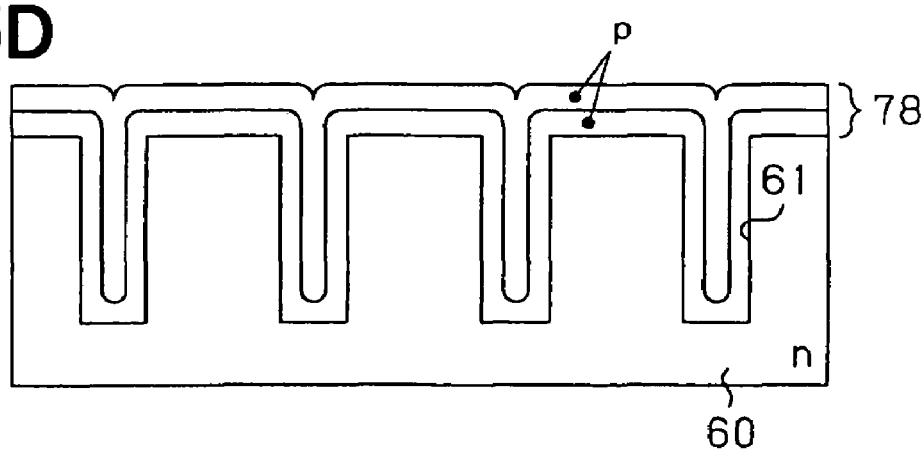

Thereafter, as shown in FIG. 25D, heat treatment is performed following the epitaxial process to diffuse the impurities in the p⁻ or non-doped epitaxial film 76 to make the epitaxial films 76, 77 into a p epitaxial layer 78. When the continuous process shown in FIGS. 26A to 26E is adopted, the vacuum pressure is made to high and a processing temperature is increased to a high temperature and a silicon source gas is not made to flow and a halogenide gas is not made to flow and a dopant gas is not made to flow. With this, a p/n column structure having a highly uniform concentration and void-less structure can be formed.

In this regard, the heat treatment can be continuously performed by stopping the film forming gas and the dopant gas and by controlling a processing temperature in an epitaxial film forming apparatus. Alternatively, the impurities can be diffused by a thermal oxidization process or a heat treatment process, which is a downstream process, after the silicon substrate is carried out of the epitaxial film forming apparatus. Further, a super-junction device requires for the p/n column structure to the same amount of charges. As shown in FIG. 25C, even in a state where the p⁻ or non-doped epitaxial film 76 remains, when the amount of charge in the n region of the silicon substrate 60 is equal to the amount of charge in the p⁺ epitaxial film (filled p epitaxial region) 77, the device can perform a super-junction operation. Therefore, even when the device has a structure not subjected to a heat treatment, the device can perform a desired operation.

As described above, in this embodiment, the trenches 61 are formed in the silicon substrate 60 and then the epitaxial film 76 is formed over the silicon substrate 60 including the bottom and side surfaces of the trenches 61. Further, at least at the final step of filling, by using the mixed gas of a silicon source gas and a halogenide gas as the gas supplied to the silicon substrate so as to form the epitaxial film at a lower vacuum pressure of growth than the vacuum pressure of growth when the epitaxial film 76 is formed over the silicon substrate 60 including the bottom and side surfaces of the trenches 61, the epitaxial film 77, which is doped with a higher concentration of impurities than the concentration of impurities of the epitaxial film 76 formed over the silicon substrate 60 including the bottom and side surfaces of the trenches 61, is formed, whereby the trenches 61 are completely filled with the epitaxial film 77. Hence, by reducing the vacuum pressure to a low pressure when the trenches 61 are completely filled with the epitaxial film 77 doped with impurities by using the mixed gas of a silicon source gas and a halogenide gas, the concentration of impurities can be made uniform (uniformity of the concentration of impurities can be improved). To be more detailed, reducing the vacuum pressure to a low pressure prevents the effect of a gas flow distribution to enable the epitaxial film to grow in the state of molecular flow, which results in improving uniformity of the concentration of impurities. Further, by forming the epitaxial film only by a silicon source gas without using the mixed gas of a silicon source gas and a halogenide gas, a reduction of throughput can be prevented (in FIG. 25, when the epitaxial film 76 is formed, a halogenide gas is not mixed, which can prevent a reduction of throughput).

Further, the vacuum pressure of growth when the epitaxial film 77, with which the trenches 61 are completely filled, is formed ranges from 1000 Pa to $1 \times 10^{-3}$ Pa. Hence, this is preferable from the viewpoint of preventing variations in the impurity concentration and of avoiding a reduction in growth rate caused by reducing the vacuum pressure.

Still further, the impurity concentration can be made uniform by forming the epitaxial film 76 over the silicon substrate 60 including the bottom and side surfaces of the trenches 61, by forming the epitaxial film 77, with which the trenches 61 are completely filled, and then by performing the heat treatment. In particular, by performing the steps of forming the epitaxial film 76 over the silicon substrate 60 including the bottom and side surfaces of the trenches 61, forming the epitaxial film 77 with which the trenches 61 are completely filled, and then heat treatment in a continuous manner in the same epitaxial film forming apparatus, that is, by adopting a continuous process, cost can be cut down.

In this regard, in the film forming step and the heat treatment step, the control of a silicon source gas, a halogenide gas, and a dopant gas has been described with the drawings, but in addition to these gases, a nonoxidative or non-nitriding gas such as hydrogen or rare gas is introduced as a carrier gas into the apparatus in the atmosphere of a reduced pressure. Further, the controlling of the vacuum pressure can be also achieved by changing the amount of flow of the carrier gas as appropriate or by controlling the exhaust capacity of an exhaust pump.

Such changes and modifications are to be understood as being within the scope of the present invention as defined by the appended claims.

What is claimed is:

1. A method for manufacturing a semiconductor device comprising the steps of:
    forming a trench in a semiconductor substrate; and
    forming an epitaxial film on the substrate including a sidewall and a bottom of the trench so that the epitaxial film is filled in the trench, wherein
    the step of forming the epitaxial film includes a final step before the trench is filled with the epitaxial film,
    the final step has a forming condition of the epitaxial film in such a manner that a mixture of a silicon source gas and a halogenide gas is used for forming the epitaxial film,
    the step of forming the epitaxial film further includes a first step,
    the first step is such that the epitaxial film having an impurity doped in the epitaxial film is formed on the bottom and the sidewall of the trench to have a predetermined thickness,
    the final step is such that the epitaxial film having no impurity doped or a low concentration impurity doped in the epitaxial film is formed to fill an inside of the trench, and
    the low concentration impurity of the epitaxial film in the final step has an impurity concentration lower than that in the first step.

2. The method according to claim 1, further comprising the step of:
    annealing the substrate after the step of forming the epitaxial film.

3. The method according to claim 2, wherein the first and the final steps in the step of forming the epitaxial film and the step of annealing the substrate are successively performed in epitaxial film forming equipment.

4. The method according to claim 1, wherein the first step is performed under a predetermined vacuum pressure lower than that of the final step.

5. The method according to claim 4, wherein the predetermined vacuum pressure of the first step is in a range between 1000 Pa and $1 \times 10^{-3}$ Pa.

6. A method for manufacturing a semiconductor device comprising the steps of:
    forming a trench in a semiconductor substrate; and
    forming an epitaxial film on the substrate including a sidewall and a bottom of the trench so that the epitaxial film is filled in the trench, wherein
    the step of forming the epitaxial film includes a final step before the trench is filled with the epitaxial film, the final step has a forming condition of the epitaxial film in such a manner that a mixture of a silicon source gas and a halogenide gas is used for forming the epitaxial film, the step of forming the epitaxial film further includes a first step and a vapor phase diffusion step, the first step is such that the epitaxial film having an impurity doped in the epitaxial film is formed on the bottom and the sidewall of the trench to have a predetermined thickness, the vapor phase diffusion step is such that an impurity is doped from a surface of the epitaxial film by a vapor phase diffusion method to form an impurity doped region in the epitaxial film, the final step is such that the epitaxial film having no impurity doped or a low concentration impurity doped in the epitaxial film is formed to fill an inside of the trench, and the low concentration impurity of the epitaxial film in the final step has an impurity concentration lower than that in the first step.

7. The method according to claim 6, wherein the vapor phase diffusion method is performed in such a manner that a dopant gas is supplied to the substrate, which is heated up to a predetermined temperature.

8. The method according to claim 6, further comprising the step of:

annealing the substrate after the step of forming the epitaxial film.

9. The method according to claim 8, wherein the first, the vapor phase diffusion and the final steps in the step of forming the epitaxial film and the step of annealing the substrate are successively performed in epitaxial film forming equipment.

10. A method for manufacturing a semiconductor device comprising the steps of:

forming a trench in a semiconductor substrate; and forming an epitaxial film on the substrate including a sidewall and a bottom of the trench so that the epitaxial film is filled in the trench, wherein the step of forming the epitaxial film includes a final step before the trench is filled with the epitaxial film, the final step has a forming condition of the epitaxial film in such a manner that a mixture of a silicon source gas and a halogenide gas is used for forming the epitaxial film, the step of forming the epitaxial film further includes a vapor phase diffusion step, the vapor phase diffusion step is such that an impurity is doped from the bottom and the sidewall of the trench by a vapor phase diffusion method to form an impurity doped region in the bottom and the sidewall of the trench, the final step is such that the epitaxial film having no impurity doped or a low concentration impurity doped in the epitaxial film is formed to fill an inside of the trench, and the low concentration impurity of the epitaxial film in the final step has an impurity concentration lower than that in the impurity doped region of the bottom and the sidewall of the trench.

11. The method according to claim 10, wherein the vapor phase diffusion method is performed in such a manner that a dopant gas is supplied to the substrate, which is heated up to a predetermined temperature.

12. The method according to claim 11, further comprising the step of:

annealing the substrate after the step of forming the epitaxial film.

13. The method according to claim 12, wherein the vapor phase diffusion and the final steps in the step of forming the epitaxial film and the step of annealing the substrate are successively performed in epitaxial film forming equipment.

14. A method for manufacturing a semiconductor device comprising the steps of:

forming a trench in a semiconductor substrate; and forming an epitaxial film on the substrate including a sidewall and a bottom of the trench so that the epitaxial film is filled in the trench, wherein the step of forming the epitaxial film includes a final step before the trench is filled with the epitaxial film, the final step has a forming condition of the epitaxial film in such a manner that a mixture of a silicon source gas and a halogenide gas is used for forming the epitaxial film, the step of forming the epitaxial film further includes a first step, the first step is such that the epitaxial film having no impurity doped or an impurity doped in the epitaxial film is formed on the bottom and the sidewall of the trench to have a predetermined thickness, the final step is such that the epitaxial film having a high concentration impurity doped in the epitaxial film is formed to fill an inside of the trench, the high concentration impurity of the epitaxial film in the final step has an impurity concentration higher than that in the first step, and the final step is performed under a predetermine vacuum pressure lower than that of the first step.

15. The method according to claim 14, wherein the epitaxial film formed in the first step is a non-dope epitaxial film.

16. The method according to claim 14, wherein the predetermined vacuum pressure of the final step is in a range between 1000 Pa and $1\times10^{-3}$ Pa.

17. The method according to claim 14, further comprising the step of:

annealing the substrate after the step of forming the epitaxial film.

18. The method according to claim 17, wherein the first and the final steps in the step of forming the epitaxial film and the step of annealing the substrate are successively performed in epitaxial film forming equipment.

* * * * *